US012593693B2

(12) United States Patent　　　　(10) Patent No.:　US 12,593,693 B2
Lin et al.　　　　　　　　　　　　(45) Date of Patent:　　Mar. 31, 2026

(54) PACKAGE LID WITH A VAPOR CHAMBER BASE HAVING AN ANGLED PORTION AND METHODS FOR FORMING THE SAME

(71) Applicant: Taiwan Semiconductor Manufacturing Company Limited, Hsinchu (TW)

(72) Inventors: Po-Yao Lin, Hsinchu County (TW); Yu-Chih Lai, Taipei (TW); Yu-Sheng Lin, Zhubei (TW); Kathy Wei Yan, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 449 days.

(21) Appl. No.: 18/110,219

(22) Filed: Feb. 15, 2023

(65) Prior Publication Data

US 2024/0274504 A1　　　Aug. 15, 2024

(51) Int. Cl.
H01L 21/56　　　　(2006.01)
H01L 21/48　　　　(2006.01)
(Continued)

(52) U.S. Cl.
CPC ........ H01L 23/427 (2013.01); H01L 21/4882 (2013.01); H01L 21/565 (2013.01); H01L 23/3128 (2013.01); H01L 23/49822 (2013.01); H01L 24/73 (2013.01); *H01L 2224/73253* (2013.01)

(58) Field of Classification Search
None
See application file for complete search history.

(56) References Cited

U.S. PATENT DOCUMENTS

2023/0317553 A1* 10/2023 Sharma ................... H01L 23/38
　　　　　　　　　　　　　　　　　　257/713
2024/0105551 A1* 3/2024 Lee ...................... H01L 23/3128

FOREIGN PATENT DOCUMENTS

JP　　　　5554444 B1　　7/2014
JP　　2022145713 A　　10/2022
KR　　20210143626 A　　11/2021

OTHER PUBLICATIONS 10 pages. Korean Patent and Trademark Office; KR Application No. 10-2023-0164013; Office Action mailed Feb. 13, 2025; 10 pages.
(Continued)

*Primary Examiner* — Jay C Chang
(74) *Attorney, Agent, or Firm* — The Marbury Law Group, PLLC

(57)　　　　　　ABSTRACT

A semiconductor package includes a package substrate, an interposer module on the package substrate, and a package lid on the interposer module and including a vapor chamber base, the vapor chamber base including a plate portion, and an angled portion extending at an angle from opposing ends of the plate portion. A method of cooling the semiconductor package may include locating the semiconductor package in an immersion cooling chamber, immersing the semiconductor package in an immersion coolant in the immersion cooling chamber such that a plate portion and an angled portion of a vapor chamber base of the package lid is immersed in the immersion coolant, and transferring heat from the plate portion and angled portion of the vapor chamber base to the immersion coolant to cool the semiconductor package.

20 Claims, 24 Drawing Sheets

(51) Int. Cl.
    *H01L 23/00*     (2006.01)
    *H01L 23/31*     (2006.01)
    *H01L 23/427*    (2006.01)
    *H01L 23/498*    (2006.01)

(56)            References Cited

OTHER PUBLICATIONS

KR Patent and Trademark Office; KR Application No. 10-2023-0164013; Notice of Allowance mailed Nov. 1, 2025; 8 pages.

* cited by examiner

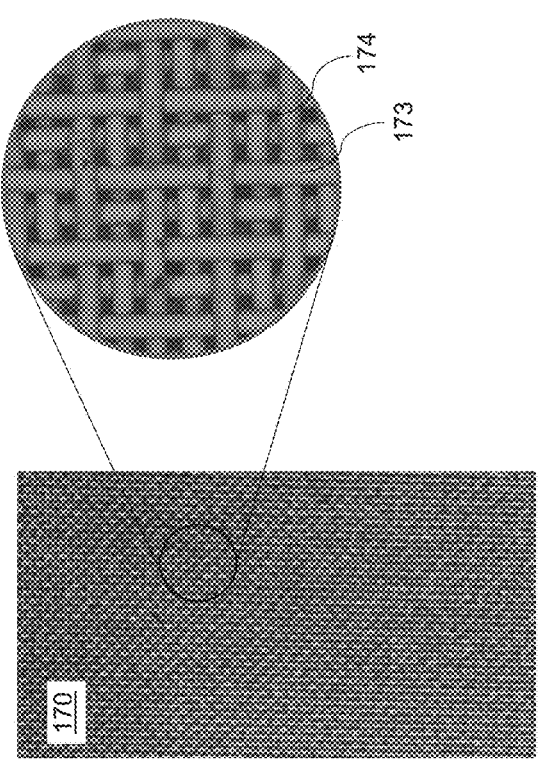
FIG. 1E
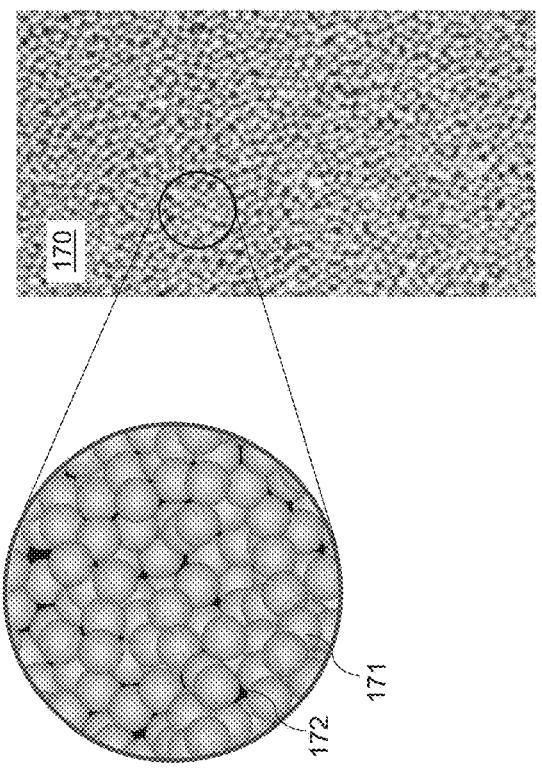
FIG. 1D
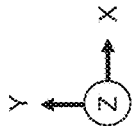

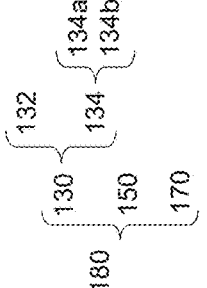
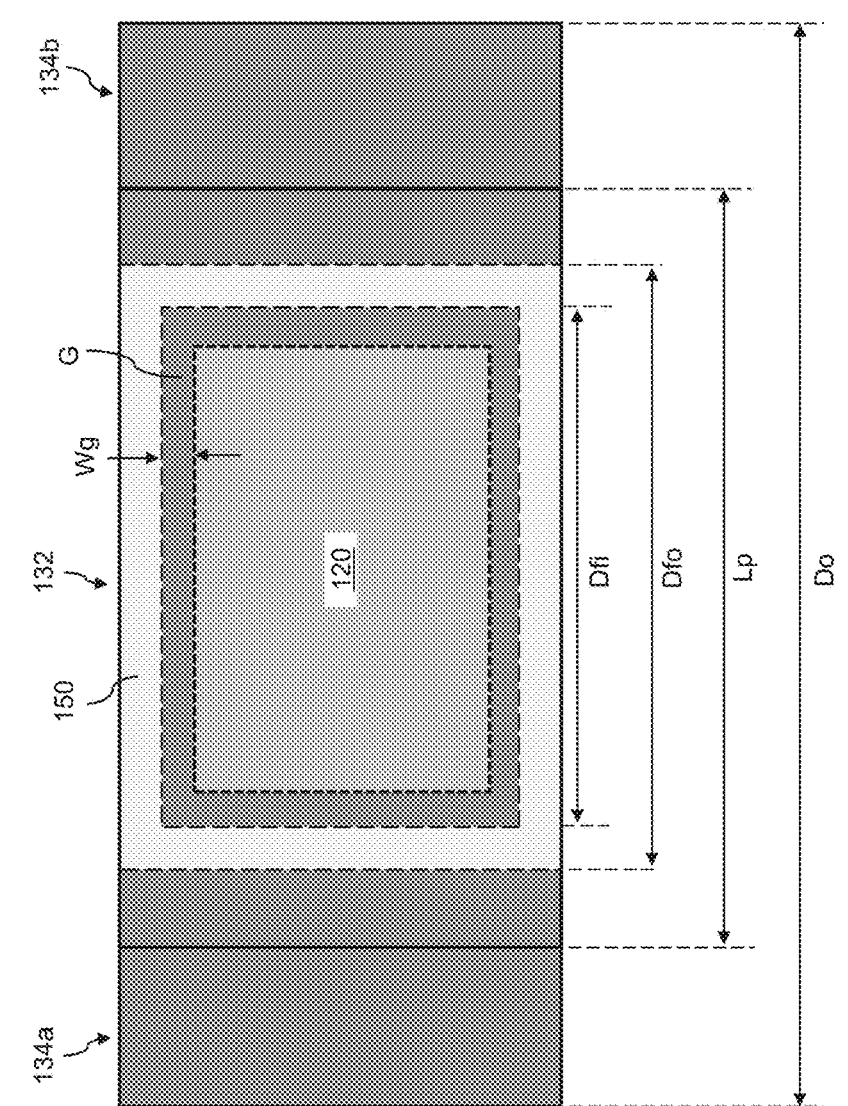
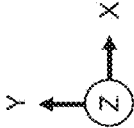
FIG. 1F

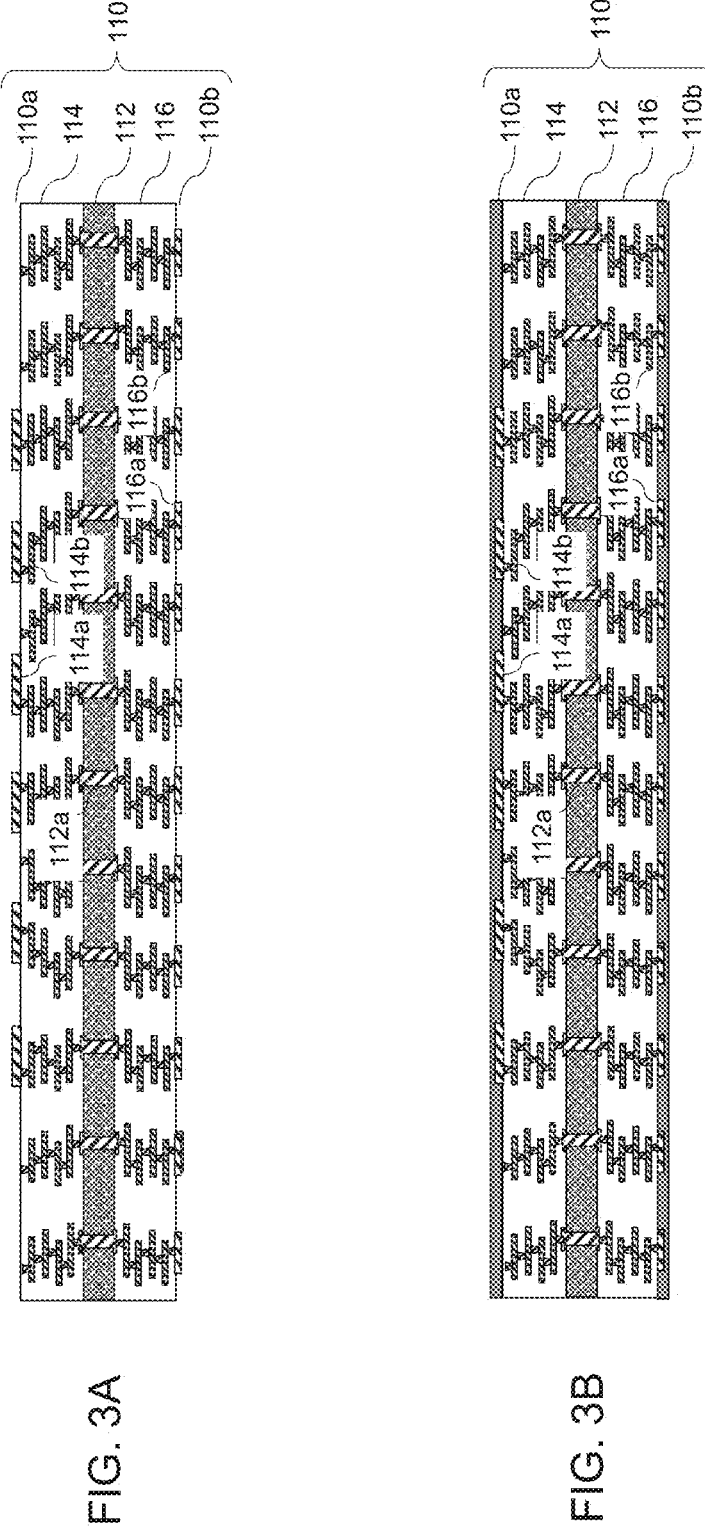
FIG. 3A
FIG. 3B
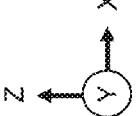

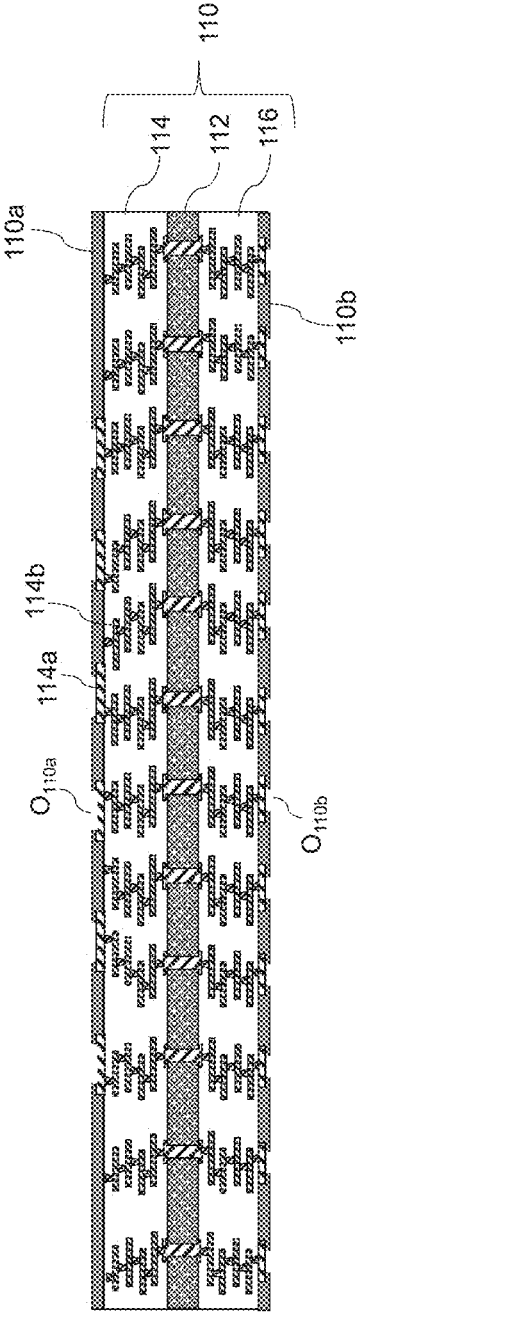
FIG. 3C
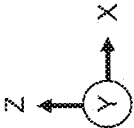

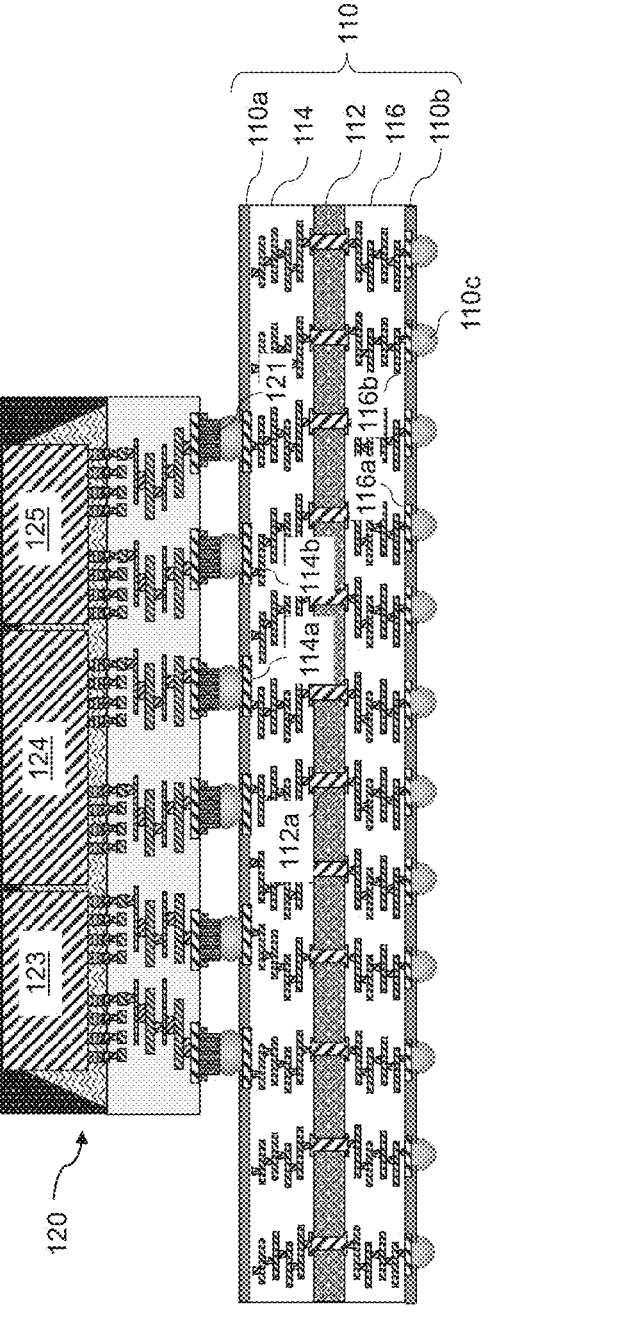
FIG. 3D
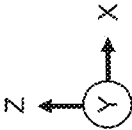

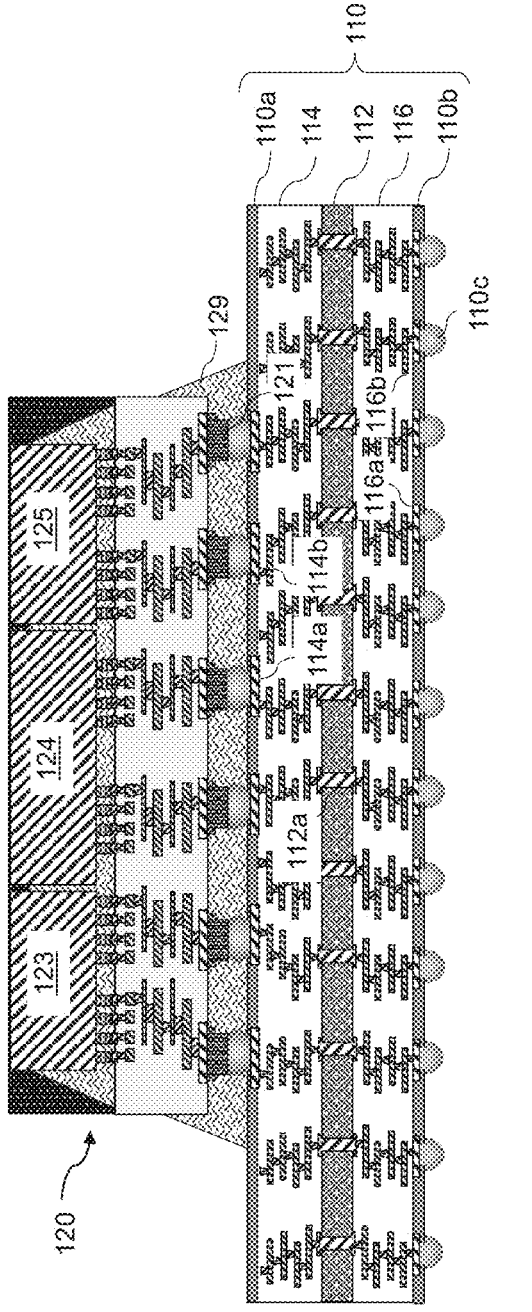
FIG. 3E
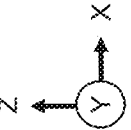

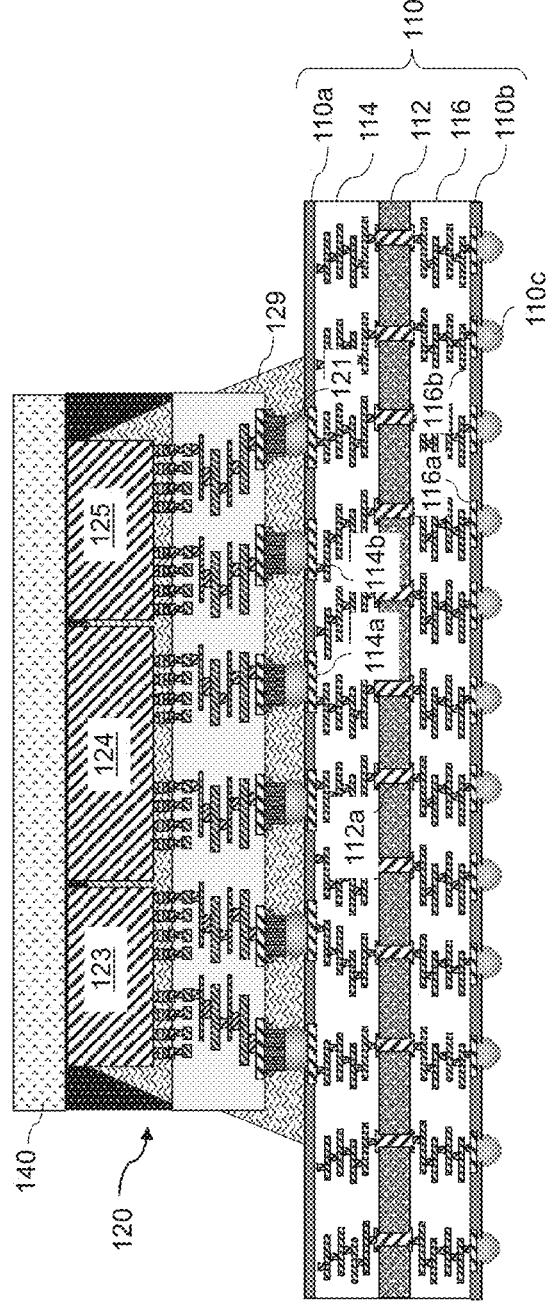
FIG. 3F
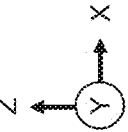

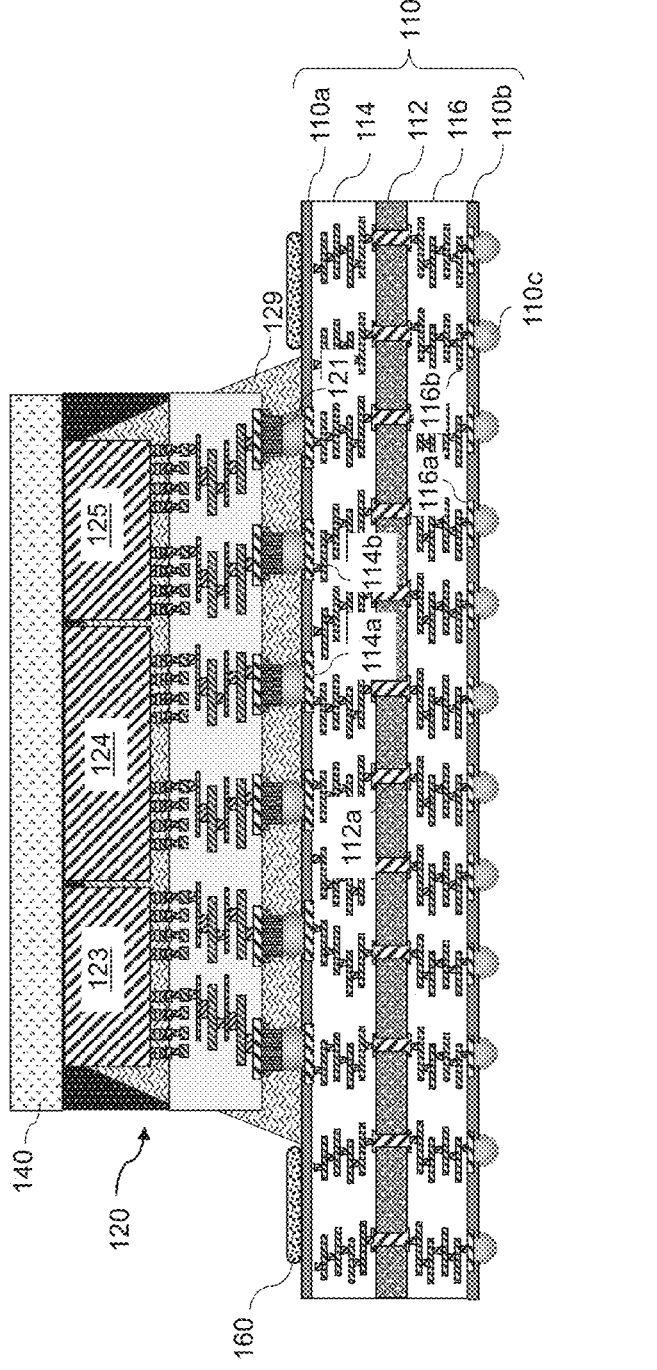
FIG. 3G
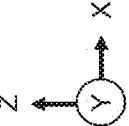

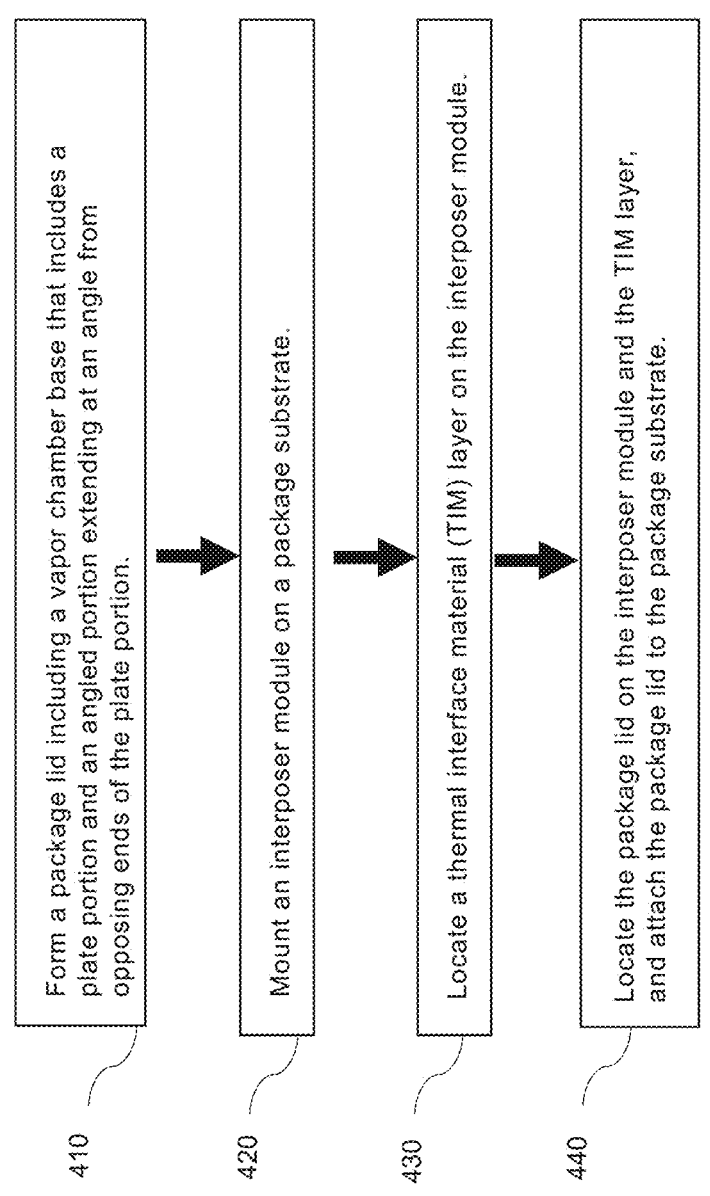

Form a package lid including a vapor chamber base that includes a plate portion and an angled portion extending at an angle from opposing ends of the plate portion.

410

Mount an interposer module on a package substrate.

420

Locate a thermal interface material (TIM) layer on the interposer module.

430

Locate the package lid on the interposer module and the TIM layer, and attach the package lid to the package substrate.

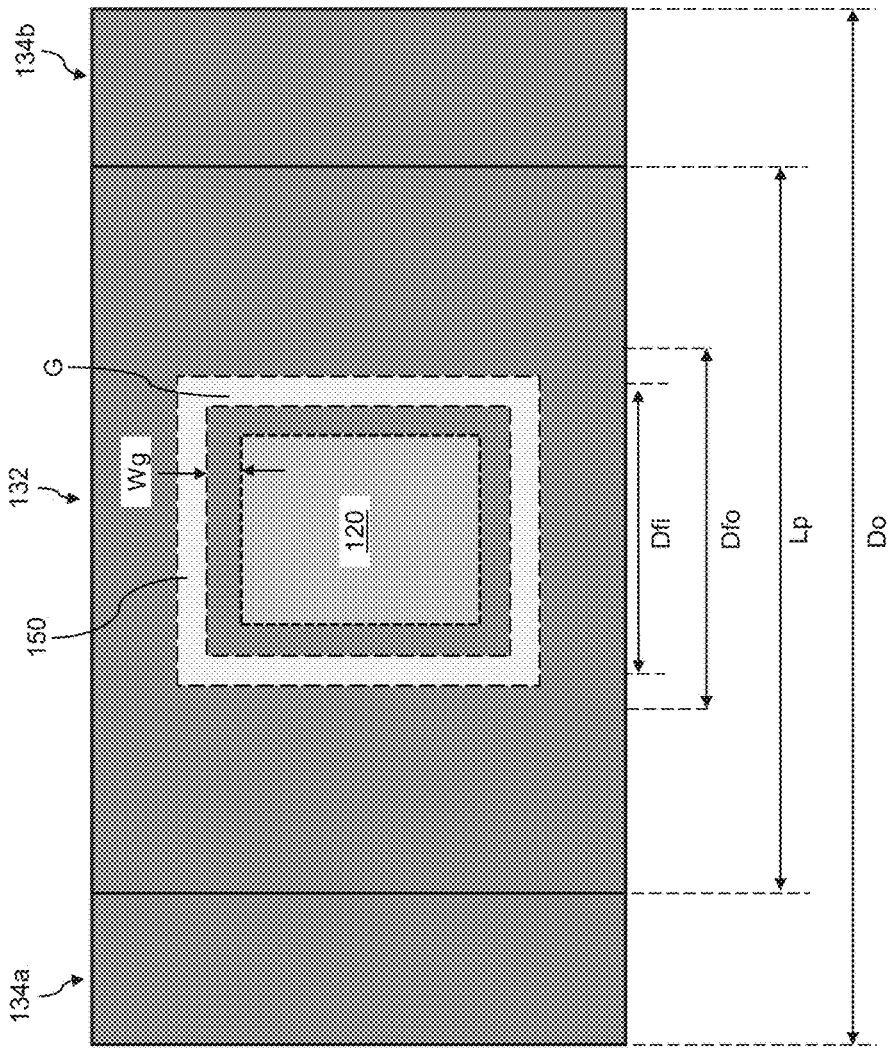
FIG. 6

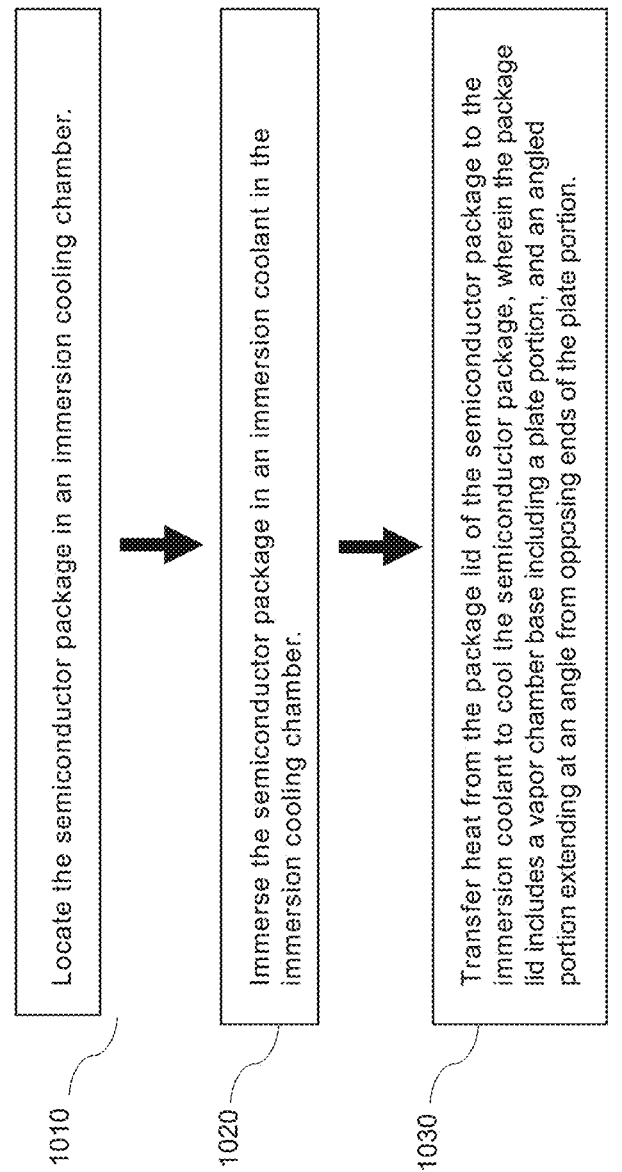

Locate the semiconductor package in an immersion cooling chamber.

1010

Immerse the semiconductor package in an immersion coolant in the immersion cooling chamber.

1020

Transfer heat from the package lid of the semiconductor package to the immersion coolant to cool the semiconductor package, wherein the package lid includes a vapor chamber base including a plate portion, and an angled portion extending at an angle from opposing ends of the plate portion.

PACKAGE LID WITH A VAPOR CHAMBER BASE HAVING AN ANGLED PORTION AND METHODS FOR FORMING THE SAME

BACKGROUND

A semiconductor package may include one or more semiconductor dies (e.g., semiconductor chips) mounted on a package substrate. Operation of the semiconductor dies may generate heat that can cause a degradation in package life and operating efficiency. Therefore, the semiconductor package may include a mechanism for removing and/or dissipating the heat generated by operation of the semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1D is a plan view of an enhancement surface including sintered metal powder (e.g., copper powder), according to one or more embodiments.

FIG. 1E is a plan view of an enhancement surface including sintered metal mesh (e.g., copper mesh), according to one or more embodiments.

FIG. 1F illustrates a plan view (e.g., top-down view) of the package lid, according to one or more embodiments.

FIG. 3A is a vertical cross-sectional view of an intermediate structure including the package substrate upper bonding pads and the package substrate lower bonding pads, according to one or more embodiments.

FIG. 3B is a vertical cross-sectional view of an intermediate structure including the package substrate upper surface layer and package substrate lower surface layer, according to one or more embodiments.

FIG. 3C is a vertical cross-sectional view of an intermediate structure including openings in the package substrate upper surface layer and openings in package substrate lower surface layer, according to one or more embodiments.

FIG. 3D illustrates a vertical cross-sectional view of an intermediate structure in which the interposer module may be mounted on the package substrate (e.g., via a flip chip bonding (FCB) process) according to one or more embodiments.

FIG. 3E illustrates a vertical cross-sectional view of an intermediate structure in which the package underfill layer may be formed on the package substrate according to one or more embodiments.

FIG. 3F illustrates a vertical cross-sectional view of an intermediate structure in which the TIM layer may be attached to the upper surface of the interposer module according to one or more embodiments.

FIG. 3G illustrates a vertical cross-sectional view of an intermediate structure in which the adhesive may be applied to the package substrate according to one or more embodiments.

FIG. 3I illustrates a vertical cross-sectional view of an intermediate structure in which a plurality of solder balls may be formed on the package substrate according to one or more embodiments.

FIG. 4 is a flow chart illustrating a method of forming a semiconductor package according to one or more embodiments.

FIG. 6 illustrates a plan view (e.g., top-down view) of a first alternative design of the semiconductor package, according to one or more embodiments.

FIG. 10 is a flow chart illustrating a method of cooling the semiconductor package according to one or more embodiments.

DETAILED DESCRIPTION

Figure 1A:
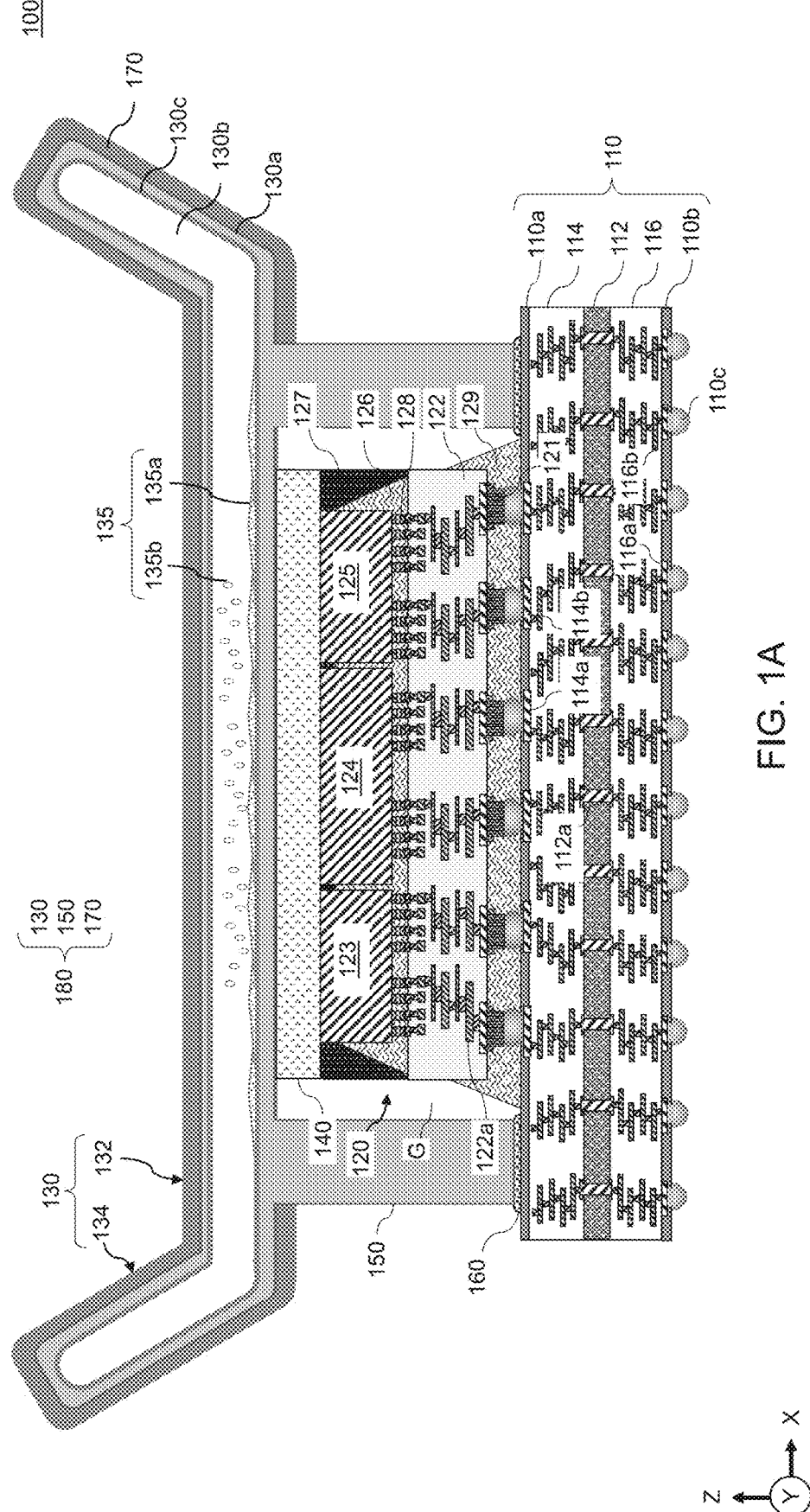
FIG. 1A illustrates a vertical cross-sectional view of the semiconductor package according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A related semiconductor package may include a flat metal lid (e.g., copper lid) with a smooth metal surface. That is, the package lid may include little or no enhancement features for improving heat dissipation in the semiconductor package. As a result, related semiconductor packages may experience difficulties dissipating heat. This may be especially problematic in semiconductor packages such as high-performance computing (HPC) semiconductor packages where efficient heat dissipation is of particular importance.

Two-phase immersion cooling (2PIC) may be an effective technology for dissipating heat in 2.5D/3D HPC high power packages. However, the package lid (e.g., copper lid) of a HPC semiconductor package immersed in a two-phase cooling system may not form vapor bubbles at a sufficient density for boiling to dissipate the large amounts of heat generated from the HPC semiconductor package. This may be due to the smooth surface (e.g., lower roughness on the top surface) of the package lid, and a high temperature gradient by poor heat spreading effect of the metal (e.g., copper) in the package lid.

Various embodiments disclosed herein may include a semiconductor package having a package lid with a vapor chamber base having an angled portion. In at least one embodiment, the angled portion may have an angle that is equal to or greater than 80° and less than 180°. In at least one embodiment, the vapor chamber base may have an extended wing shape. The novel package lid may replace the known metal lid. Various embodiment package lids may be especially suited for immersion cooling of the semiconductor package. Various embodiment package lids may provide for more uniform temperature distribution. The improved uniform temperature distribution may provide a more effective cooling area or boiling area during immersion cooling. In particular, various embodiment package lids may include a novel three-dimensional (3D) boiler lid structure for two-phase immersion cooling of a high-performance computing (HPC) semiconductor package.

An enhancement surface (e.g., a multi-structured enhancement surface) may also be formed on the vapor chamber base. The enhancement surface may include an enhancement layer. The enhancement surface may include a textured surface (e.g., a rough surface). In at least one embodiment, the enhancement surface may include a metal mesh or powder such as copper mesh or copper powder. The metal mesh or metal powder may be formed, for example, by a sintering process that may increase a number of cavities (e.g., small cavities) in the enhancement surface. The cavities may encourage the formation of vapor bubbles on the vapor chamber base and thereby enhance heat spreading. In particular, the cavities may enhance bubble growth density and effectively enhance boiling heat transfer for a high power HPC semiconductor package in a two-phase immersion cooling system.

The various embodiment semiconductor packages disclosed herein having a novel package lid design may provide a thermal solution for high power semiconductor packages. In particular, an enhancement surface on an extended wing shape vapor chamber base may reduce a junction-to ambient resistance ($\Psi$JA) by at least about 34.4% compared to a traditional copper package lid.

Figure 1B:
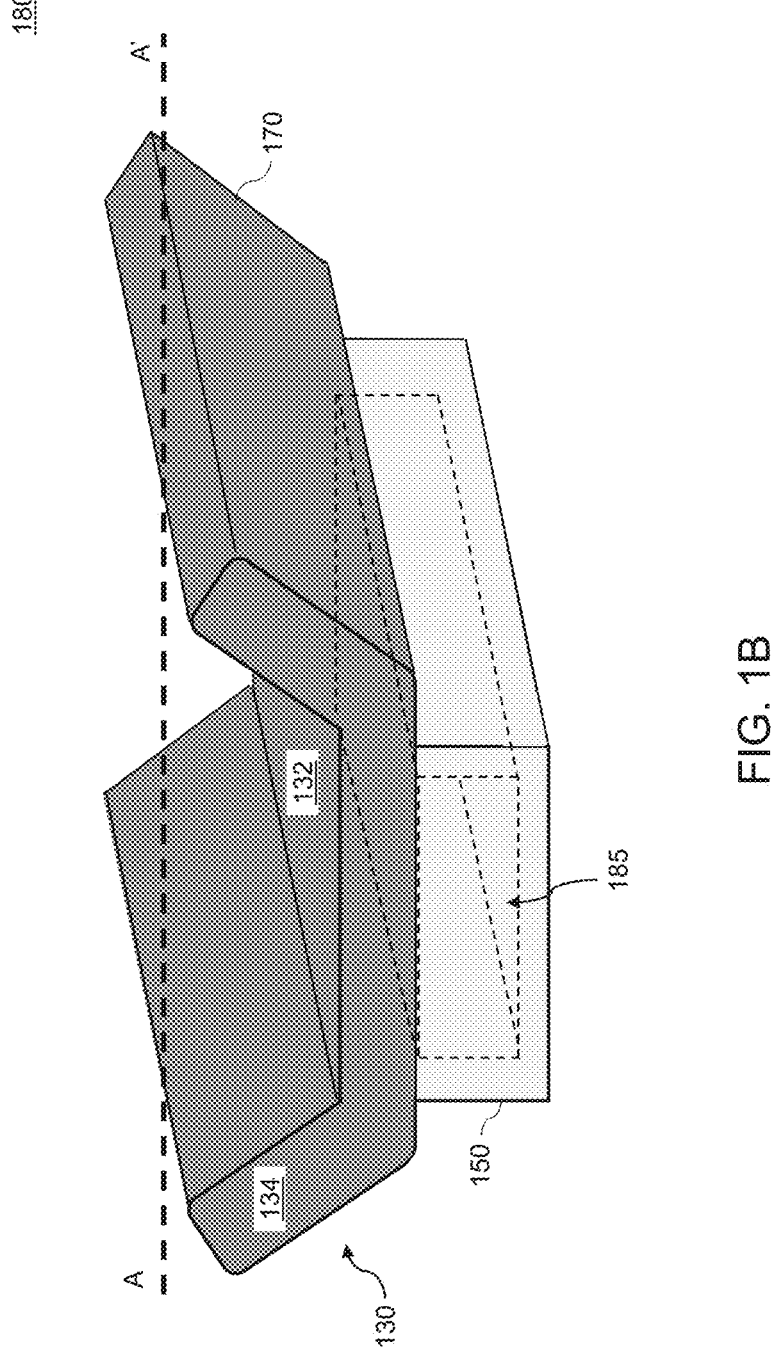
FIG. 1B illustrates a perspective view of the package lid according to one or more embodiments.
Figure 1C:
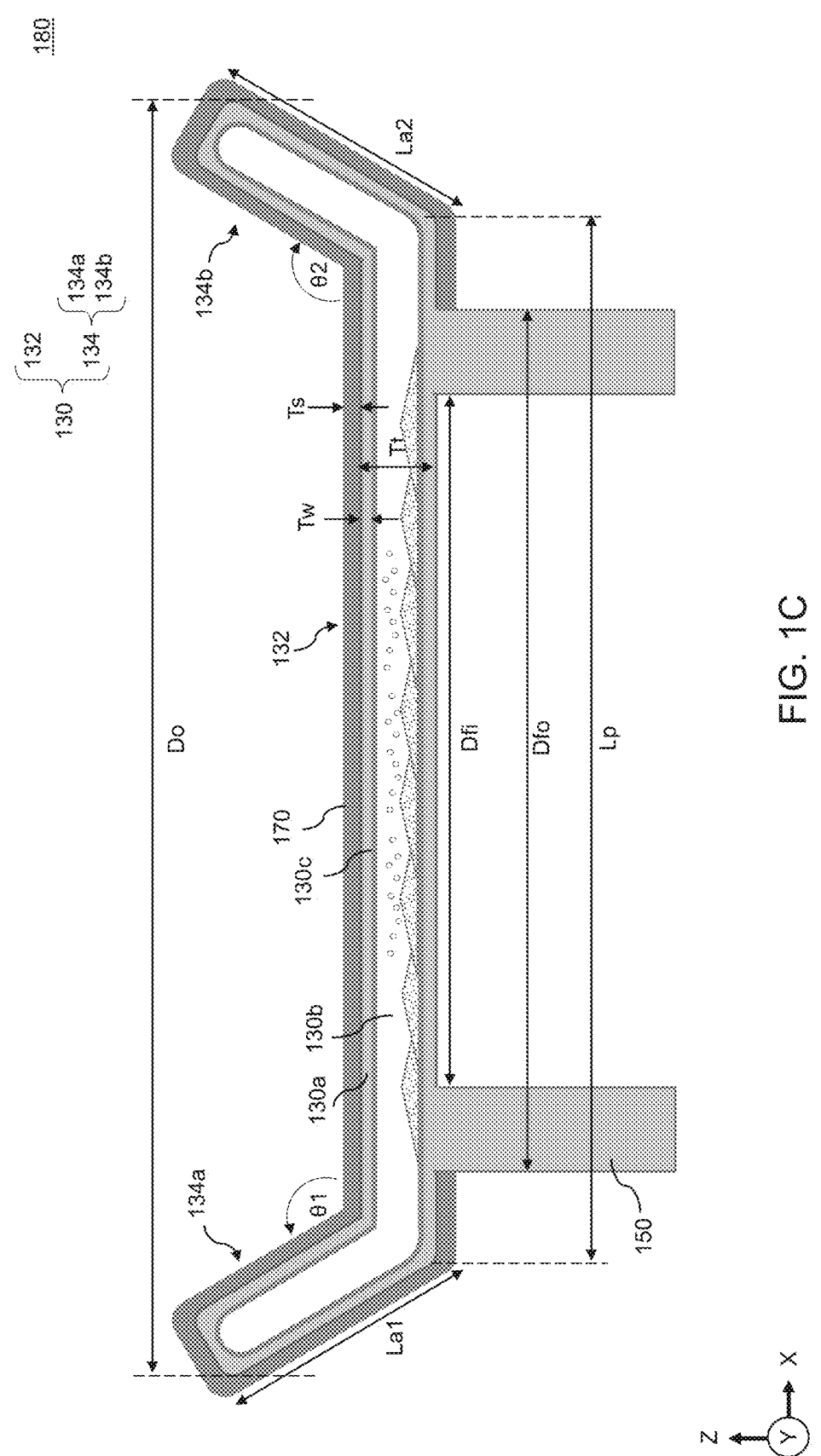
FIG. 1C illustrates a vertical cross-sectional view of the vapor chamber base along line A-A' in FIG. 1B, according to one or more embodiments.

FIGS. 1A-1C provide different views of a semiconductor package 100 (e.g., organic/silicon interposer package) according to one or more embodiments. FIG. 1A illustrates a vertical cross-sectional view of the semiconductor package 100 according to one or more embodiments.

The semiconductor package 100 may include a package substrate 110, an interposer module 120 mounted on the package substrate 110, and a package lid 180 on the interposer module 120 and attached to the package substrate 110. The semiconductor package 100 may also include a thermal interface material (TIM) layer 140 on the interposer module 120. The package lid 180 may include, for example, a vapor chamber base 130 including a plate portion 132, and an angled portion 134 extending at an angle from opposing ends of the plate portion 132. The package lid 180 may also include a foot portion 150 extending from the vapor chamber base 130 and attached to the package substrate 110.

The package substrate 110 may include, for example, a core 112, a package substrate upper dielectric layer 114 formed on the core 112 (e.g., a first side or chip-side of the package substrate 110), and a package substrate lower dielectric layer 116 formed on the core 112 (e.g., a second side or board-side of the package substrate 110). In particular, the package substrate 110 may include a build-up film substrate such as an Ajinomoto build-up film (ABF) substrate. That is, in at least one embodiment, each of the package substrate upper dielectric layer 114 and the package substrate lower dielectric layer 116 may be described as an ABF layer.

The core 112 may help to provide rigidity to the package substrate 110. The core 112 may include, for example, an epoxy resin such as a bismaleimide triazine epoxy (BT epoxy) and/or a woven glass laminate. The core 112 may alternatively or in addition include an organic material such as a polymer material. In particular, the core 112 may include a dielectric polymer material such as polyimide (PI), benzocyclo-butene (BCB), or polybenzobisoxazole (PBO). Other suitable dielectric materials are within the contemplated scope of disclosure.

The core 112 may include one or more through vias 112a. The one or more through vias 112a may extend from a lower surface of the core 112 to an upper surface of the core 112. The one or more through vias 112a may allow an electrical connection between the package substrate upper dielectric layer 114 and the package substrate lower dielectric layer 116. The one or more through vias 112a may include, for example, one or more layers and may include metals, metal alloys, and/or or other metal-containing compounds (e.g., Cu, Al, Mo, Co, Ru, W, TiN, TaN, WN, etc.). Other suitable metal materials are within the contemplated scope of disclosure.

The package substrate lower dielectric layer 116 may include a plurality of layers and, in particular, may include a build-up film (e.g., ABF). The package substrate lower dielectric layer 116 may include an organic material such as a polymer material. In particular, the package substrate lower dielectric layer 116 may include one or more layers of dielectric polymer material such as polyimide (PI), benzocyclobutene (BCB), or polybenzobisoxazole (PBO). Other suitable dielectric materials are within the contemplated scope of disclosure.

The package substrate lower dielectric layer 116 may include one or more package substrate lower bonding pads 116a on a board-side surface of the package substrate lower dielectric layer 116. In particular, the package substrate lower bonding pads 116a may be exposed on the board-side surface of the package substrate lower dielectric layer 116. The package substrate lower dielectric layer 116 may also include one or more metal interconnect structures 116b. The metal interconnect structures 116b may be connected to the package substrate lower bonding pads 116a and the through vias 112a in the core 112. The metal interconnect structures 116b may include metal layers (e.g., copper traces) and metal vias connecting the metal layers. The package substrate lower bonding pads 116a and the metal interconnect structures 116b may include, for example, one or more layers and may include metals, metal alloys, and/or or other metal-containing compounds (e.g., Cu, Al, Mo, Co, Ru, W, TIN, TaN, WN, etc.). Other suitable metal materials are within the contemplated scope of disclosure.

A package substrate lower surface layer 110b may be formed on the board-side surface of the package substrate lower dielectric layer 116. The package substrate lower surface layer 110b may partially cover the package substrate lower bonding pads 116a. The package substrate lower surface layer 110b may include one or more of a passivation layer and protection layer. The package substrate lower surface layer 110b may include, for example, a dielectric polymer material such as polyimide (PI), benzocyclobutene (BCB), or polybenzobisoxazole (PBO). The package substrate lower surface layer 110b may alternatively or additionally include silicon oxide, silicon nitride, low-k dielectric materials such as carbon-doped oxides, extremely low-k dielectric materials such as porous carbon doped silicon dioxide, or a combination thereof. Other suitable dielectric materials are within the contemplated scope of disclosure.

A ball-grid array (BGA) including a plurality of solder balls 110c may be formed on the board-side surface of the package substrate lower dielectric layer 116. The solder balls 110c may allow the semiconductor package 100 to be securely mounted on a substrate such as a printed circuit board (PCB) and electrically coupled to the substrate. The solder balls 110c may contact the package substrate lower bonding pads 116a, respectively.

The package substrate upper dielectric layer 114 may be formed on an upper surface of the core 112. The package substrate upper dielectric layer 114 may also include a plurality of layers and, in particular, may include a build-up film (e.g., ABF). The package substrate upper dielectric layer 114 may also include an organic material such as a polymer material. In particular, the package substrate upper dielectric layer 114 may include a dielectric polymer material such as polyimide (PI), benzocyclobutene (BCB), or polybenzobisoxazole (PBO). Other suitable dielectric materials are within the contemplated scope of disclosure.

The package substrate upper dielectric layer 114 may include one or more package substrate upper bonding pads 114a on a chip-side surface of the package substrate upper dielectric layer 114. In particular, the package substrate upper bonding pads 114a may be exposed on the chip-side surface of the package substrate upper dielectric layer 114. In at least one embodiment, a bonding pad surface layer (not shown) (e.g., one or more layers of metals (e.g., tin, nickel, palladium, gold, etc.) and/or other materials) may be formed on the package substrate upper bonding pads 114a to improve solder joint reliability.

The package substrate upper dielectric layer 114 may also include one or more metal interconnect structures 114b. The metal interconnect structures 114b may include metal layers (e.g., copper traces) and metal vias connecting the metal layers. The package substrate upper bonding pads 114a may be electrically connected to the solder balls 110c of the BGA by way of the metal interconnect structures 114b, the through vias 112a, the metal interconnect structures 116b, and the package substrate lower bonding pads 116a. The package substrate upper bonding pads 114a and the metal interconnect structures 114b may include, for example, one or more layers and may include metals, metal alloys, and/or or other metal-containing compounds (e.g., Cu, Al, Mo, Co, Ru, W, TiN, TaN, WN, etc.). Other suitable metal materials are within the contemplated scope of disclosure.

A package substrate upper surface layer 110a may be formed on the chip-side surface of the package substrate upper dielectric layer 114. The package substrate upper surface layer 110a may including a coating layer, laminate layer, etc. The package substrate upper surface layer 110a may be formed so as to at least partially cover the package substrate upper bonding pads 114a.

In at least one embodiment, the package substrate upper surface layer 110a may include a solder resist layer (e.g., solder mask layer). The solder resist layer may include a thin layer of polymer material (e.g., epoxy polymer). The solder resist layer may have a thickness in a range from about 5 μm to 50 μm. Greater or lesser thickness of the solder resist layer may be used. The solder resist layer may be formed so as to cover the package substrate upper bonding pads 114a and other metal features (e.g., conductive lines, copper traces) on the chip-side surface of the package substrate 110. The solder resist layer may protect the package substrate upper bonding pads 114a and other metal features from oxidation. The solder resist layer may also inhibit (e.g., prevent) solder bridges (e.g., unintended electrical connections) from forming between closely spaced metal features. The solder resist layer may include solder resist openings (SROs) over the package substrate upper bonding pads 114a, respectively. An upper surface of the package substrate upper bonding pads 114a may be exposed through the SROs. The SROs may have a tapered sidewall so that a diameter of the SRO (in the x-y plane) may decrease in a direction toward the package substrate upper bonding pad 114a.

The package substrate upper surface layer 110a may alternatively or additionally include a layer other than a solder resist layer, such as a passivation layer or protection layer. In particular, the package substrate upper surface layer 110a may alternatively or additionally include a dielectric polymer material such as polyimide (PI), benzocyclo-butene (BCB), or polybenzobisoxazole (PBO), silicon oxide, silicon nitride, low-k dielectric materials such as carbon-doped oxides, extremely low-k dielectric materials such as porous carbon doped silicon dioxide, a combination thereof or other suitable material. The package substrate upper surface layer 110a may alternatively or additionally be formed, for example, by chemical vapor deposition (CVD), physical vapor deposition (PVD), spin coating, lamination or other suitable deposition technique.

The interposer module 120 may be mounted by C4 bumps 121 on the package substrate upper bonding pads 114a in the package substrate 110. The interposer module 120 may include an interposer dielectric layer 122 that may include one or more layers of dielectric material. The dielectric material may include, for example, a dielectric polymer material such as polyimide (PI), benzocyclo-butene (BCB), or polybenzobisoxazole (PBO). Other suitable dielectric materials are within the contemplated scope of disclosure. The interposer dielectric layer 122 may further include metal interconnects 122a electrically connected to the C4 bumps 121. A package underfill layer 129 may be formed under and around the interposer module 120 and the C4 bumps 121 so as to fix the interposer module 120 to the package substrate 110. The package underfill layer 129 may be formed of an epoxy-based polymeric material.

The interposer module 120 may also include a first semiconductor die 123, second semiconductor die 124 and third semiconductor die 125 that may each be mounted on the interposer dielectric layer 122. It should be noted that any number of semiconductor dies may be mounted on the interposer dielectric layer 122. The first semiconductor die 123, second semiconductor die 124 and third semiconductor die 125 may be mounted on the interposer dielectric layer 122 by micro-bumps 128 that may be electrically connected to the metal interconnects 122a.

Each of the first semiconductor die 123, second semiconductor die 124 and third semiconductor die 125 may include, for example, a semiconductor chip or chiplet for a high performance computing (HPC) application, an artificial intelligence (AI) application, and a 5G cellular network application, a logic die (e.g., mobile application processor, microcontroller, etc.), or a memory die (e.g., dynamic random access memory (DRAM) die, a Wide I/O die, a M-RAM die, a R-RAM die, a NAND die, static random access memory (SRAM), etc.), a central processing unit (CPU) chip, graphics processing unit (GPU) chip, field-programmable gate array (FPGA) chip, networking chip, application-specific integrated circuit (ASIC) chip, artificial intelligence/deep neural network (AI/DNN) accelerator chip, etc., a co-processor, accelerator, an on-chip memory buffer, a memory cube (e.g., HBM, HMC, etc.), a high data rate transceiver die, a I/O interface die, a IPD die (e.g., integrated passives device), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), a monolithic 3D heterogeneous chiplet stacking die, a system on chip (SOC) die, a chip on wafer on substrate (CoWoS) die an integrated fan-out (InFO) die, etc.

Each of the first semiconductor die 123, second semiconductor die 124 and third semiconductor die 125 may include, for example, an active region (not shown). The active region may include a front end of line (FEOL) region including electronic circuitry including various electronic devices (e.g., transistors, resistors, etc.). In particular, the FEOL region may include one or more logic circuits including logic devices (e.g., logic gates) and/or one or more memory circuits including memory devices (e.g., volatile memory (VM) devices and/or non-volatile memory (NVM) devices). The active region may also include a back end of line (BEOL) region that may include interlayer dielectric having a plurality of dielectric layers. The dielectric layers may include, for example, SiO2, a dielectric polymer or other suitable dielectric material. The interlayer dielectric may include one or more metal interconnect structures formed therein. The metal interconnect structures may include metal traces and metal vias formed in the dielectric layers and provide an electrical connection to the electronic circuitry in the FEOL region.

An interposer underfill layer 126 may be formed around the micro-bumps 128 and between the first semiconductor die 123 and the interposer dielectric layer 122, between the second semiconductor die 124 and the interposer dielectric layer 122, and between the third semiconductor die 125 and the interposer dielectric layer 122. The interposer underfill layer 126 may be formed continuously under the first semiconductor die 123, second semiconductor die 124 and third semiconductor die 125, as illustrated in FIG. 1A. Alternatively, the interposer underfill layer 126 may be formed as separate portions under each of the first semiconductor die 123, second semiconductor die 124 and third semiconductor die 125. The interposer underfill layer 126 may also be formed between first semiconductor die 123, second semiconductor die 124 and third semiconductor die 125. The interposer underfill layer 126 may also be formed of an epoxy-based polymeric material.

A molding material layer 127 may be formed over the first semiconductor die 123, second semiconductor die 124, third semiconductor die 125, the interposer underfill layer 126 and the interposer dielectric layer 122. The molding material layer 127 may be formed of an epoxy molding compound (EMC).

The TIM layer 140 may include, for example, a gel TIM, graphite TIM, metal TIM, solder TIM and a carbon nanotube TIM. Other types of TIMs are within the contemplated scope of this disclosure. In at least one embodiment, the TIM layer 140 may be in a range from 30 $\mu$m to 150 $\mu$m. The TIM layer 140 may be formed on the interposer module 120 to dissipate of heat generated during operation of the semiconductor package 100 (e.g., operation of first semiconductor die 123, second semiconductor die 124, and third semiconductor die 125. The TIM layer 140 may be attached to the interposer module 120, for example, by a thermally conductive adhesive. In particular, the TIM layer 140 may contact an upper surface of first semiconductor die 123, an upper surface of the second semiconductor die 124, an upper surface of the third semiconductor die 125, an upper surface of the molding material layer 127 and/or an upper surface of the interposer underfill layer 126. The TIM layer 140 may have a low bulk thermal impedance and high thermal conductivity. The bond-line-thickness (BLT) (e.g., a distance between the package lid 180 and the interposer module 120) may be less than about 100 $\mu$m, although greater or lesser distances may be used.

The foot portion 150 of the package lid 180 may securely fix the package lid 180 to the package substrate 110. The foot portion 150 may substantially surround (e.g., encircle) the interposer module 120 on the package substrate 110 in the x-y plane. The foot portion 150 may extend in a substantially perpendicular direction (e.g., in the z-direction) from the package substrate 110. The foot portion 150 may help to provide rigidity to the package substrate 110. The foot portion 150 may be formed of a metal such as copper, a copper alloy, aluminum or an aluminum alloy. Other materials are within the contemplated scope of disclosure.

The foot portion 150 that may be fixed to the package substrate 110 by an adhesive 160 such as a silicone adhesive or an epoxy adhesive. Other adhesives are within the contemplated scope of this disclosure. The adhesive 160 may form a substantially air-tight and water-tight seal between the package lid 180 and the package substrate 110.

A gap G may be formed between the foot portion 150 and the interposer module 120. The gap G may extend in the z-direction from the package substrate 110 to an upper surface of the TIM layer 140. The gap G may include, for example, an air space. In at least one embodiment, the gap G may be filled with a TIM layer protection structure (not shown) that may include, for example, an epoxy-based polymeric material. A length (in the x-direction) of the gap G may be substantially uniform over the height (in the z-direction) of the interposer module 120 (e.g., interposer dielectric layer 122, molding material layer 127 and TIM layer 140). The length of the gap G may be great enough to ensure that foot portion 150 does not contact the package underfill layer 129.

The vapor chamber base 130 of the package lid 180 may be connected to the foot portion 150 so as to cover the interposer module 120. The vapor chamber base 130 may include the plate portion 132 and the angled portion 134 extending at an angle from opposing ends (e.g., in the x-direction in FIG. 1A) of the plate portion 150.

The vapor chamber base 130 (e.g., planar heat pipe or a vapor chamber heat spreader) may include a two-phase structure for dissipating heat generated by the interposer module 120 (including the first semiconductor die 123, second semiconductor die 124, and third semiconductor die 125). As illustrated in FIG. 1A, the vapor chamber base 130 may include a vapor chamber enclosure 130a that encloses a vapor chamber space 130b (e.g., a vacuum core region formed in a central portion of the vacuum chamber base 130). The vapor chamber enclosure 130a may include a vacuum sealed enclosure (e.g., envelope, housing, etc.) that houses a vapor chamber wick structure 130c and a vapor chamber working fluid 135.

The vapor chamber enclosure 130a may be located on the interposer module 120. In at least one embodiment, the vapor chamber enclosure 130a may directly contact the TIM layer 140. In at least one embodiment, the TIM layer 140 may be compressed between a bottom surface of the vapor chamber enclosure 130a and the upper surface of the interposer module 120 (e.g., the upper surface of first semiconductor die 123, the upper surface of the second semiconductor die 124, the upper surface of the third semiconductor die 125, an upper surface of the molding material layer 127 and/or an upper surface of the interposer underfill layer 126).

The vapor chamber enclosure 130a may be integrally formed (e.g., formed as a unit) with the foot portion 150. The vapor chamber enclosure 130a may be formed of the same material as the foot portion 150. In particular, the vapor chamber base 130 may be formed of a metal such as copper, a copper alloy, aluminum or an aluminum alloy. Other materials are within the contemplated scope of disclosure.

The vapor chamber working fluid 135 may exist in the vapor chamber enclosure 130a as a liquid vapor chamber working fluid 135a and/or gaseous vapor chamber working fluid 135b. Heat generated by the interposer module 120 may cause the liquid vapor chamber working fluid 135a in the plate portion 132 near the interposer module 120 to vaporize into the gaseous vapor chamber working fluid 135b. The gaseous vapor chamber working fluid 135b may carry heat away from the plate portion 132 near the interposer module 120 to a cooler region within the vapor chamber enclosure 130a. The cooler region may include, for example, the angled portion 134 of the vapor chamber base 130.

Thus, the plate portion 132 may function as an evaporator in which the liquid vapor chamber working fluid 135a may be evaporated into a vapor. The angled portion 134 may function as a condenser in which the gaseous vapor chamber working fluid 135b may be condensed back to a liquid.

The vapor chamber wick structure 130c may be affixed to an inner wall of the vapor chamber enclosure 130a. The vapor chamber wick structure 130c may promote the transport the liquid vapor chamber working fluid 135a from the angled portion 134 of the vapor chamber base 130 to the plate portion 132 near the interposer module 120. The vapor chamber wick structure 130c may include, for example, a screen structure, a sintered structure (e.g., sintered powder, sintered copper) and/or a grooved structure. The liquid vapor chamber working fluid 135a (e.g., water) may be held within the vapor chamber wick structure 130c (e.g., by absorption, adsorption, etc.) around an inner periphery of the vapor chamber enclosure 130a.

By utilizing the vapor chamber wick structure 130c, the vapor chamber base 130 may cool the semiconductor package 100 by operating a continuous cycle of evaporation and condensation of the vapor chamber working fluid 135. The continuous cycle may include, for example, 1) evaporating the liquid vapor chamber working fluid 135a (e.g., phase change from liquid to vapor) within the vapor chamber wick structure 130c in the plate portion 132 into the gaseous vapor chamber working fluid 135b, 2) condensing the gaseous vapor chamber working fluid 135b (e.g., phase change from vapor to liquid) in the angled portion 134 back into the liquid vapor chamber working fluid 135a, and 3) transporting—by use of the vapor chamber wick structure 130c—the liquid vapor chamber working fluid 135 from the angled portion 134 back to the plate portion 132. In particular, the condensed liquid vapor chamber working fluid 135a may be passively pumped from the angled portion 134 back to the plate portion 132 by a capillary action along the vapor chamber wick structure 130c.

FIG. 1B illustrates a perspective view of the package lid 180 according to one or more embodiments. The plate portion 132 may have a shape in a plan view (e.g., the z-direction) that is substantially the same as a shape of the interposer module 120 in the plan view. In particular, the plate portion 132 may have a square shape or rectangular shape in the plan view. Other shapes are within the contemplated scope of disclosure.

The package lid 180 may include an interposer module housing portion 185 (indicated by dashed lines in FIG. 1B). The interposer module housing portion 185 may be located under a central portion of the plate portion 132 of the vapor chamber base 130. The interposer module housing portion 185 may be surrounded in the x-y plane by the foot portion 150. In particular, the foot portion 150 may be connected to the plate portion 132 of the vapor chamber base 130 around all four-sides (in the x-y plane) of the plate portion 132. Thus, the interposer module housing portion 185 of the package lid 180 may be bounded in the x-y plane by the foot portion 150 and bounded in the z-direction by a bottom surface of the vapor chamber base 130 (e.g., the bottom surface of the vapor chamber enclosure 130a (not shown)).

The interposer module 120 may be housed within the interposer module housing portion 185 in the semiconductor package 100. The interposer module 120 may be located within the interposer module housing portion 185 so as to form the gap G around an entirety of the interposer module 120 in the x-y plane. That is, a size of the interposer module housing portion 185 in the x-y plane may be greater than a size of the interposer module 120 in the x-y plane by a size of the gap G.

FIG. 1C illustrates a vertical cross-sectional view of the vapor chamber base 130 along line A-A' in FIG. 1B, according to one or more embodiments. As illustrated in FIG. 1C, opposing inner sides of the foot portion 150 may be separated by a distance Dfi in the x-direction. In at least one embodiment, the distance Dfi may be in a range from 1.2 times the length of the interposer module 120 (in the x-direction) to 4.0 times the length of the interposer module 120. The length Lp of the plate portion 132 may be greater than the distance Dfi between opposing inner sides of the foot portion 150 in the x-direction. In at least one embodiment, the length Lp of the plate portion 132 may be in a range from 1.3 times the distance Dfi to 2.0 times the distance Dfi.

As further illustrated in FIG. 1C, the angled portion 134 may include a first angled portion part 134a formed at an angle θ1 with an upper surface of the plate portion 132. The length Lp of the plate portion 132 may be greater than a length La1 of the first angled portion part 134a. In at least one embodiment, the length Lp of the plate portion 132 may be in a range from 1.5 times the length La1 to 5.0 times the length La1.

The angled portion 134 may also include a second angled portion part 134b formed at an angle θ2 with the upper surface of the plate portion 132. The length Lp of the plate portion 132 may also be greater than a length La2 of the second angled portion part 134b. In at least one embodiment, the length Lp of the plate portion 132 may be in a range from 1.5 times the length La2 to 5.0 times the length La2. The length La2 may or may not be the same as the length La1. A distance Do in the x-direction between a distal end (relative to the plate portion 132) of the first angled portion part 134a and a distal end of the second angled portion part 134b may be greater than or equal to a distance Dfo between opposing outer sides of the foot portion 150 in the x-direction.

As illustrated in FIG. 1C, the first angled portion part 134a and the second angled portion part 134b may give the vapor chamber base 130 an extended wing shape.

The angle θ1 between the first angled portion part 134a and the upper surface of the plate portion 132 may be greater than or equal to 80° and less than 180° (80°≤θ1<180°). The angle θ2 between the second angled portion part 134b and the upper surface of the plate portion 132 may be greater than or equal to 80° and less than 180° (80°≤θ2<180°). The angle θ2 may or may not be the same as angle θ1.

The vapor chamber enclosure 130a may have a total thickness Tt (e.g., a distance between outer walls of the vapor chamber enclosure 130a). A thickness Tw of a wall of the vapor chamber enclosure 130a may be greater than or equal to 0.25 times the total thickness Tt of the vapor chamber enclosure 130a (Tw≥0.25 Tt).

As further illustrated in FIG. 1C, the package lid 180 may also include an enhancement surface 170 on an outer wall of the vapor chamber enclosure 130a. The enhancement surface 170 may have a thickness Ts that is less than or equal to 0.05 times the total thickness Tt of the vapor chamber base 130 (Ts≤0.05 Tt). The enhancement surface 170 may include multiple structures (e.g., a multi-structured enhancement surface). The enhancement surface 170 may be formed on substantially the entire surface of an outer wall of the vapor chamber enclosure 130a. In at least one embodiment, the enhancement surface 170 may not be formed on the outer wall of the vapor chamber enclosure 130a between opposing inner walls of the foot portion 150. This may allow the outer wall of the vapor chamber enclosure 130a between the foot portion 150 to directly contact the TIM layer 140 in the semiconductor package 100 (see FIG. 1A).

The enhancement surface 170 may include one or more enhancement layers including an uneven upper surface The enhancement surface 170 may include a porous surface having a plurality of cavities. The enhancement surface 170 may include a textured surface on the outer wall of the vapor chamber enclosure 130a. The textured surface may include, for example, a rough surface or roughened surface on the outer wall of the vapor chamber enclosure 130a. The enhancement surface 170 may include one or more enhancement layers on the outer wall of the vapor chamber enclosure 130a.

In at least one embodiment, the enhancement surface 170 may include the same material as the vapor chamber wick structure 130c and have substantially the same thickness as the vapor chamber wick structure 130c. In at least one embodiment, the enhancement surface 170 may include a metal mesh or powder such as copper mesh or copper powder. The metal mesh or metal powder may be formed, for example, by a sintering process that may increase a number of cavities (e.g., small cavities) in the enhancement surface 170. The cavities may include, for example, holes, pores, recessed areas, depressed portions, etc. formed on the outer wall of the vapor chamber enclosure 130a.

The cavities in the enhancement surface 170 may be especially helpful in facilitating heat transfer from the vapor chamber base 130 in the case where the semiconductor package 100 (see FIG. 1A) is being cooled by immersion cooling. In particular, in the case of immersion cooling, the cavities may help to form vapor bubbles on the vapor chamber base 130 and thereby promote or enhance heat spreading in the vapor chamber base 130 and/or heat transfer from the vapor chamber base 130 to the immersion cooling fluid. The cavities in the enhancement surface 170 may, therefore, allow the package lid 180 to include a more uniform temperature distribution and thereby provide a more effective cooling area or boiling surface area during immersion cooling of the semiconductor package 100. In at least one embodiment, the cavities in the enhancement layer 170 may help to enhance bubble growth density and effectively enhance boiling heat transfer for a high power HPC semiconductor package in a two-phase immersion cooling system.

FIGS. 1D and 1E are plan views (e.g., top-down views) of alternative designs of the enhancement surface 170, according to one or more embodiments. In particular, FIG. 1D is a plan view of an enhancement surface 170 including sintered metal powder (e.g., copper powder), according to one or more embodiments. The metal powder may be sintering bonded to the outer wall of the vapor chamber enclosure 130a, for example, by a thermal compression bonding process. In at least one embodiment, the sintered metal powder may include one or more layers of metal particles 171 (e.g., randomly arranged metal particles) having a diameter in a range from 1 μm to 200 μm. The sintered metal powder may also include cavities (e.g., pores) 172 between the metal particles 171. The cavities 172 may have a diameter in a range of 1 μm to 200 μm.

FIG. 1E is a plan view of an enhancement surface 170 including sintered metal mesh (e.g., copper mesh), according to one or more embodiments. The metal mesh may also be sintering bonded to the outer wall of the vapor chamber enclosure 130a, for example, by a thermal compression bonding process. In at least one embodiment, the sintered metal mesh may include one or more layers of metal wires 173 arranged in an interwoven manner. The metal wires 173 may have a diameter in a range from 1 μm to 200 μm. The sintered metal mesh may also include cavities (e.g., pores) 174 between the metal wires 173. The cavities 174 may have a diameter in a range of 1 μm to 200 μm.

FIG. 1F illustrates a plan view (e.g., top-down view) of the package lid 180, according to one or more embodiments. As illustrated in FIG. 1F, the interposer module 120 may have a rectangular shape with a longitudinal direction in the x-direction. The package lid 180 may also have a longitudinal direction in the x-direction. In particular, the vapor chamber base 130 may have a longitudinal direction in the x-direction.

Further, the gap G may have a width Wg that may be substantially uniform around the entire periphery of the interposer module 120. The foot portion 150 may have a rectangular shape that is substantially similar to the shape of the interposer module 120. Further, a length of the foot portion 150 in the y-direction may be substantially the same as a length of the vapor chamber base 130 in the y-direction. Thus, as illustrated in FIG. 1F, a portion of the outer wall of the foot portion 150 extending in the x-direction may be substantially aligned with a portion of an outer wall of the vapor chamber base 130 extending in the x-direction.

Figure 2A:
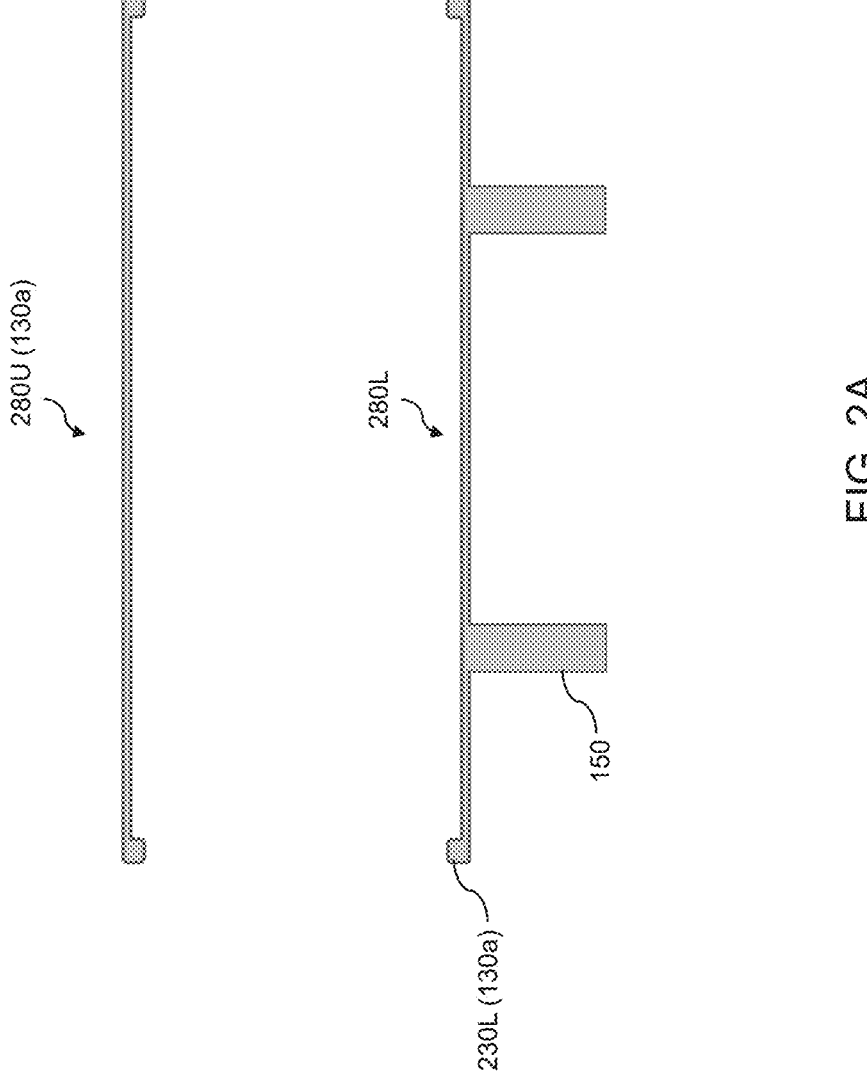
FIG. 2A illustrates a vertical cross-sectional view of an intermediate structure including an upper package lid part and a lower package lid part, according to one or more embodiments.

FIGS. 2A-2D illustrate a method of forming the package lid 180 according to one or more embodiments. FIG. 2A illustrates a vertical cross-sectional view of an intermediate structure including an upper package lid part 280U and a lower package lid part 280L, according to one or more embodiments. The upper package lid part 280U and lower package lid part 280L may be formed using the same process. In at least one embodiment, the upper package lid part 280U and lower package lid part 280L may be formed, for example, by milling using a computer numerical control (CNC) milling machine, or by molding or stamping. The upper package lid part 280U and lower package lid part 280L may be formed of the same materials. In at least one embodiment, the upper package lid part 280U and lower package lid part 280L may be formed of a metal such as copper, a copper alloy, aluminum or an aluminum alloy.

The upper package lid part 280U may include an upper portion of the vapor base enclosure 130a. As illustrated in FIG. 2A, the lower package lid part 280L may include a lower vapor chamber base part 230L and the foot portion 150. The lower package lid part 280L may include a lower portion of the vapor base enclosure 130a.

The foot portion 150 may be formed together with the lower vapor chamber base part 230L by computer numerical control (CNC) milling machine, or by molding or stamping. Alternatively, the foot portion 150 may be formed separately (e.g., by CNC milling machine, molding or stamping) from the lower vapor chamber base part 230L, and then connected (e.g., bonded, welded, etc.) to the lower vapor chamber base part 230L by brazing and/or soldering.

Figure 2B:
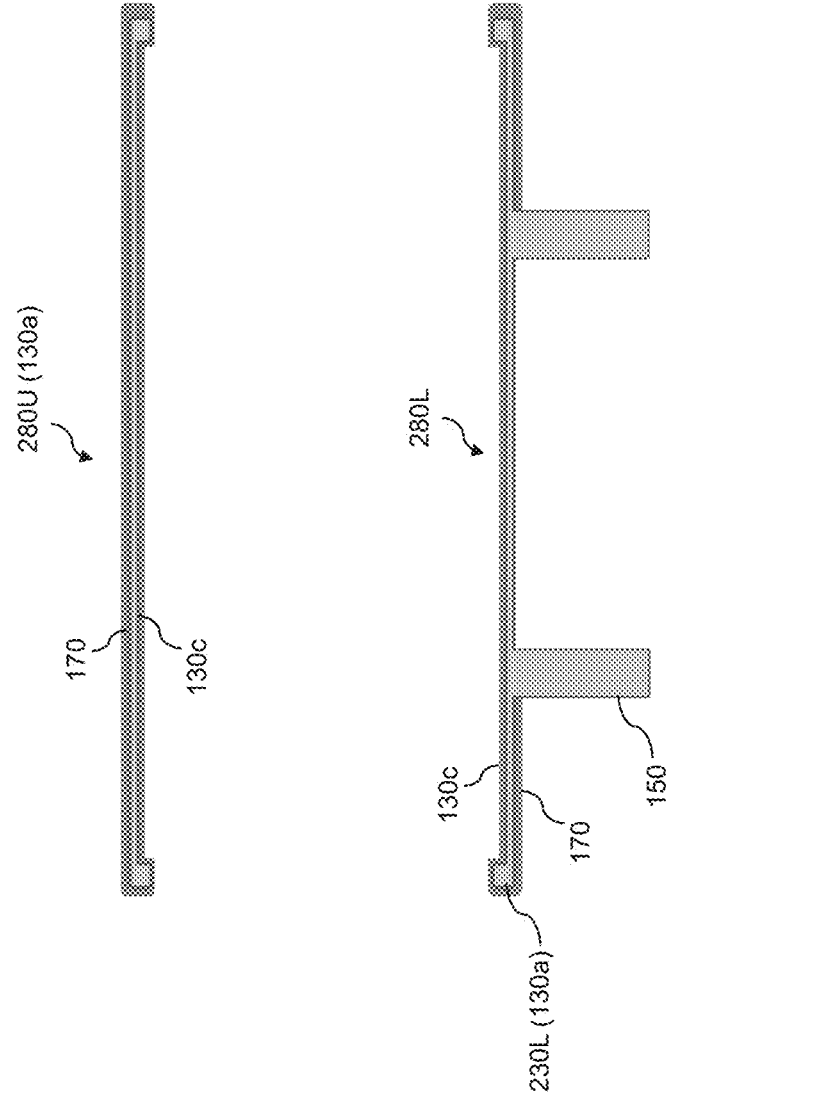
FIG. 2B is a vertical cross-sectional view of an intermediate structure including the vapor chamber base wick structure and the enhancement surface, according to one or more embodiments.

FIG. 2B is a vertical cross-sectional view of an intermediate structure including the vapor chamber base wick structure 130c and the enhancement surface 170, according to one or more embodiments. As illustrated in FIG. 2B, the vapor chamber base wick structure 130c and the enhancement surface 170 may be formed on the upper package lid part 280U. In particular, the vapor chamber base wick structure 130c may be formed on an inner surface of the upper package lid part 280U. The enhancement surface 170 may be formed on an outer surface of the upper package lid part 280U.

The vapor chamber base wick structure 130c and the enhancement surface 170 may also be formed on the lower vapor chamber base part 230L of the package lid part 280U. In particular, the vapor chamber base wick structure 130c may be formed on an inner surface of the lower vapor chamber base part 230L. The enhancement surface 170 may be formed on an outer surface of the lower vapor chamber base part 230L. As illustrated in FIG. 2B, the enhancement surface 170 may not be formed on a portion of the outer surface of the lower vapor chamber base part 230L that is between the inner walls of the foot portion 150.

The vapor chamber base wick structure 130c and the enhancement surface 170 may be formed of substantially the same materials (e.g., a metal mesh or powder such as copper mesh or copper powder). The vapor chamber base wick structure 130c and the enhancement surface 170 may be formed to have substantially the same thickness. The vapor chamber base wick structure 130c and the enhancement surface 170 may be formed at the same time and in the same forming process. The forming process may include a sintering process. In at least one embodiment, a metal mesh or metal powder may be sintered and bonded to the surface of the upper package lid part 280U using a thermal compression bonding process. In at least one embodiment, a pressing tool (e.g., a graphite fixture) may be used to press a thin metal mesh or metal powder on the surface of the upper package lid part 280U under a high pressure, and heated in a furnace to a high temperature so as to sinter the metal mesh or metal powder and bond the sintered metal mesh or metal powder to the surface of the upper package lid part 280U. The sintering process may result in the formation of a plurality of cavities in a surface of the enhancement surface 170.

Figure 2C:
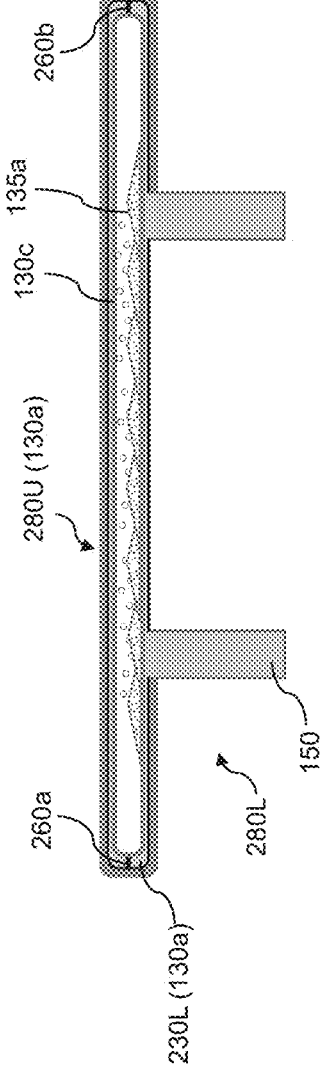
FIG. 2C is a vertical cross-sectional view of an intermediate structure including a first bond seam and second bond seam, according to one or more embodiments.

FIG. 2C is a vertical cross-sectional view of an intermediate structure including a first bond seam 260a and second bond seam 260b, according to one or more embodiments. As illustrated in FIG. 2C, the upper package lid part 280U may be bonded to the lower package lid part 280L. The upper package lid part 280U may be bonded to the lower package lid part 280L, for example, by a brazing process or a soldering process. In particular, a contact surface on opposing ends of the upper package lid part 280U may be cleaned (e.g., by grinding, polishing, etc.) so as to remove the material used to form the vapor chamber base wick structure 130c and the enhancement surface 170. A contact surface on opposing ends of the lower package lid part 280L may also be cleaned (e.g., by grinding, polishing, etc.) so as to remove the material used to form the vapor chamber base wick structure 130c and the enhancement surface 170. The contact surface of the upper package lid part 280U may then be brought into contact with the contact surface of the lower package lid part 280L.

The brazing process or soldering process may then be performed so as to securely bond the contact surface of the upper package lid part 280U to the contact surface of the lower package lid part 280L. In particular, upper portion of the vapor base enclosure 130a in the upper package lid part 280U may be bonded to the lower portion of the vapor base enclosure 130a in the lower package lid part 280L. In particular, the bonding process (e.g., brazing process or soldering process) may result in the formation of a first bond seam 260a between the upper portion of the vapor base enclosure 130a and lower portion of the vapor base enclosure 130a at one end of the intermediate structure. The bonding process (e.g., brazing process or soldering process) may result in the formation of a second bond seam 260b between the upper portion of the vapor base enclosure 130a and lower portion of the vapor base enclosure 130a at an opposing end of the intermediate structure.

As illustrated in FIG. 2C, prior to bonding bond the contact surface of the upper package lid part 280U to the contact surface of the lower package lid part 280L, the vapor chamber base working fluid 135a (e.g., water) may be placed on the vapor chamber base wick structure 130c of the lower package lid part 280L. The bonding process may therefore combine the upper package lid part 280U to the lower vapor chamber base part 230L form a flat vapor chamber.

Figure 2D:
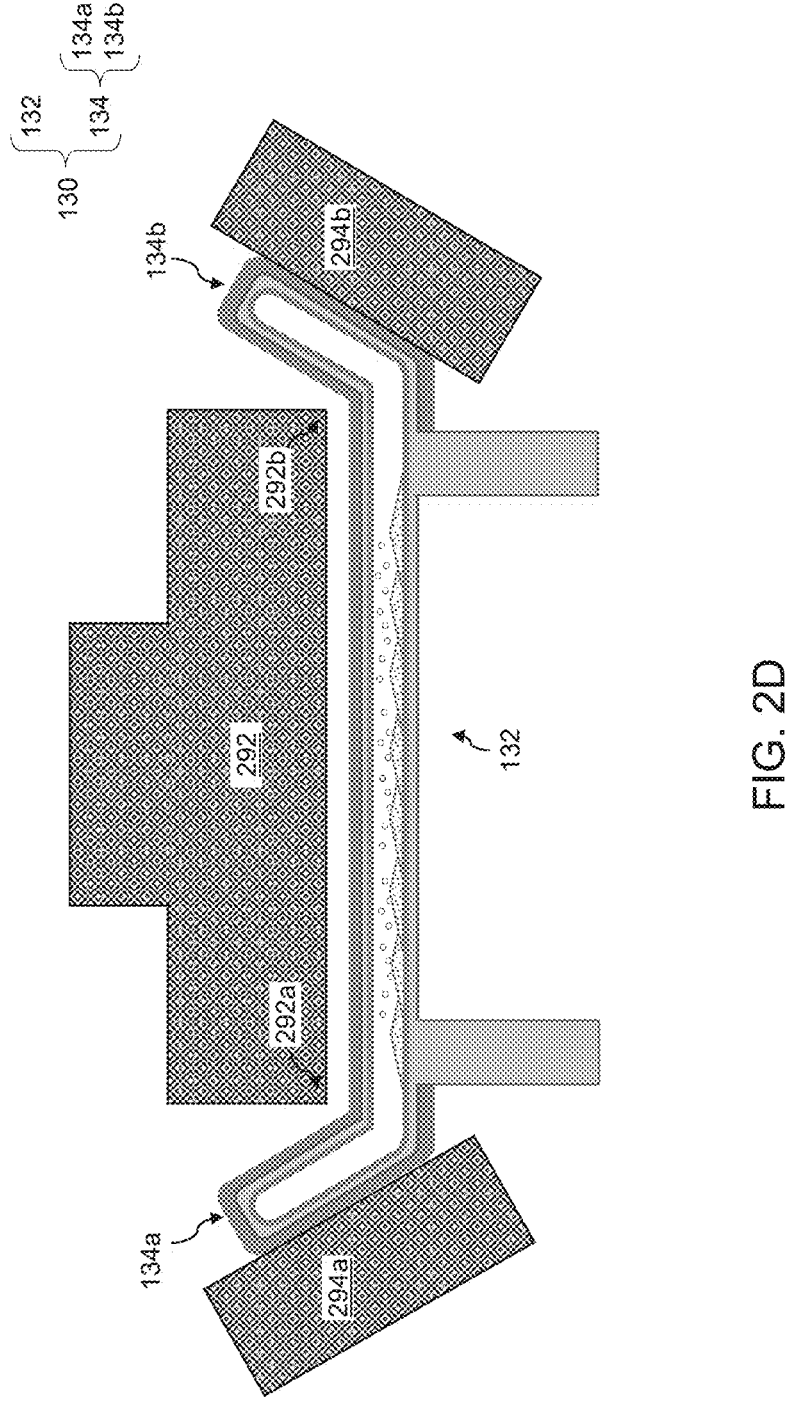
FIG. 2D is a vertical cross-sectional view of an intermediate structure including the first angled portion part and the second angled portion part, according to one or more embodiments.

FIG. 2D is a vertical cross-sectional view of an intermediate structure including the first angled portion part 134a and the second angled portion part 134b, according to one or more embodiments. As illustrated in FIG. 2D, vapor chamber base 130 may be formed by bending the flat vapor chamber of FIG. 2C. In at least one embodiment, the flat vapor chamber may be bent by stamping with a stamping machine. The stamping machine may include, for example, a center portion 292 that may contact the plate portion 132 of the intermediate structure. The center portion 292 may include a first corner 292a for forming the angle θ1 between the first angled portion part 134a and the upper surface of the plate portion 132. The center portion 292 may also include a second corner 292b for forming the angle θ2 between the second angled portion part 134b and the upper surface of the plate portion 132.

The stamping machine may also include a first side portion 294a for contacting the first angled portion part 134a. The stamping machine may also include a second side portion 294b for contacting the second angled portion part 134b.

The stamping machine may form the first angled portion part 134a and second angled portion part 134b by pressing the center portion 292 downward on the plate portion 132 while maintaining the first side portion 294a and second side portion 294b in a fixed position. The stamping machine may alternatively form the first angled portion part 134a and second angled portion part 134b by maintaining the center portion 292 in a fixed position while pressing the first side portion 294a and second side portion 294b upward. The stamping machine may alternatively form the first angled portion part 134a and second angled portion part 134b by pressing the center portion 292 downward while pressing the first side portion 294a and second side portion 294b upward. The forming of the package lid 180 including a vapor chamber base 130 with an angled portion (e.g., a 3D boiler) may be completed with the stamping process.

FIGS. 3A-3I illustrate a method of forming the semiconductor package 100 according to one or more embodiments.

FIG. 3A is a vertical cross-sectional view of an intermediate structure including the package substrate upper bonding pads 114a and the package substrate lower bonding pads 116a, according to one or more embodiments. The package substrate upper bonding pads 114a may be formed, for example, on an uppermost dielectric layer of the package substrate upper dielectric layer 114. The package substrate upper bonding pads 114a may be formed so as to contact the metal interconnect structures 114b. The package substrate upper bonding pads 114a may be formed by depositing a metal layer (e.g., copper, aluminum or other suitable conductive materials) on the uppermost dielectric layer of the package substrate upper dielectric layer 114. The metal layer may then be patterned by etching (e.g., by wet etching, dry etching, etc.) so as to form the package substrate upper bonding pads 114a. Other suitable metal layer materials and etching processes may be within the contemplated scope of disclosure.

The package substrate lower bonding pads 116a may be formed, for example, on a lowest dielectric layer of the package substrate lower dielectric layer 116. The package substrate lower bonding pads 116a may be formed so as to contact the metal interconnect structures 116b. The package substrate lower bonding pads 116a may be formed by depositing a metal layer (e.g., copper, aluminum or other suitable conductive materials) on the lowest dielectric layer of the package substrate upper dielectric layer 114. The metal layer may then be patterned by etching (e.g., by wet etching, dry etching, etc.) so as to form the package substrate lower bonding pads 116a. Other suitable metal layer materials and etching processes may be within the contemplated scope of disclosure.

After formation, the package substrate upper bonding pads 114a and package substrate lower bonding pads 116a may optionally undergo a surface roughening treatment (e.g., CZ treatment). In the surface roughening treatment, a surface of the package substrate upper bonding pads 114a (e.g., a copper surface) and surface of the package substrate lower bonding pads 116a (e.g., a copper surface) may be etched by an organic acid-type microetching solution, to create a super-roughened surface (e.g., copper surface). The uniquely-roughened copper surface topography of the package substrate upper bonding pads 114a and package substrate lower bonding pads 116a may help to achieve a high copper-to-resin adhesion.

FIG. 3B is a vertical cross-sectional view of an intermediate structure including the package substrate upper surface layer 110a and package substrate lower surface layer 110b, according to one or more embodiments. In at least one embodiment, the package substrate upper surface layer 110a may include a solder resist layer (e.g., polymer material), also referred to as a solder mask. The package substrate upper surface layer 110a may also be referred to as the upper solder resist layer 110a, and the package substrate lower surface layer 110b may also be referred to as the lower solder resist layer 110b.

The package substrate upper surface layer 110a and package substrate lower surface layer 110b may be applied concurrently. The package substrate upper surface layer 110a and package substrate lower surface layer 110b may be applied, for example, as a liquid photo-imagable film. The liquid photo-imagable film can be applied, for example, by silk-screening or spraying the liquid photo-imagable film onto the surface of the package substrate 110. The liquid photo-imagable film may be applied over the package substrate upper bonding pads 114a and the package substrate lower bonding pads 116a. The package substrate upper surface layer 110a and package substrate lower surface layer 110b may alternatively be applied as a dry-film photo-imagable film that may be vacuum-laminated onto the surface of the package substrate 110 and over the package substrate upper bonding pads 114a and the package substrate lower bonding pads 116a, respectively.

The package substrate upper surface layer 110a and package substrate lower surface layer 110b may be applied so as to have a thickness that is slightly greater than a thickness of the package substrate upper bonding pads 114a and the package substrate lower bonding pads 116a, respectively. Alternatively, the package substrate upper surface layer 110a and package substrate lower surface layer 110b may be applied so as to have an upper surface that is substantially co-planar with an upper surface of the package substrate upper bonding pads 114a and the package substrate lower bonding pads 116a, respectively.

FIG. 3C is a vertical cross-sectional view of an intermediate structure including openings O110a in the package substrate upper surface layer 110a and openings O110b in package substrate lower surface layer 110b, according to one or more embodiments.

Openings O110a may be formed in the package substrate upper surface layer 110a so as to expose an upper surface of the package substrate upper bonding pads 114a. Openings O110b may be formed in the package substrate lower surface layer 110b so as to expose an upper surface of the package substrate lower bonding pads 116a. The openings O110*a* and the openings O110*b* may be formed, for example, by using a photolithographic process. In at least one embodiment, the openings O110*a* and the openings O110*b* may be formed in separate photolithographic processes.

The photolithographic process (e.g., processes) used to form the openings O110*a* may include forming a patterned photoresist mask (not shown) on the package substrate upper surface layer 110*a*, and etching (e.g., wet etching, dry etching, etc.) the exposed upper surface of the package substrate upper surface layer 110*a* through openings in the photoresist mask. The photoresist mask may be subsequently removed by ashing, dissolving the photoresist mask or by consuming the photoresist mask during the etch process.

The photolithographic process (e.g., processes) used to form the openings O110*b* may include forming a patterned photoresist mask (not shown) on the package substrate lower surface layer 110*b*, and etching (e.g., wet etching, dry etching, etc.) the exposed upper surface of the package substrate lower surface layer 110*b* through openings in the photoresist mask. The photoresist mask may be subsequently removed by ashing, dissolving the photoresist mask or by consuming the photoresist mask during the etch process.

After the openings O110*a* are formed in the package substrate upper surface layer 110*a* and the openings O110*b* are formed in the package substrate lower surface layer 110*b*, the package substrate upper surface layer 110*a* (upper solder resist layer) and the package substrate lower surface layer 110*b* may be cured such as by a thermal cure or ultraviolet (UV) cure.

FIG. 3D illustrates a vertical cross-sectional view of an intermediate structure in which the interposer module 120 may be mounted on the package substrate 110 (e.g., via a flip chip bonding (FCB) process) according to one or more embodiments. As illustrated in FIG. 3D, the C4 bumps 121 of the interposer module 120 may be positioned on the package substrate upper bonding pads 114*a* of the package substrate 110 and heated in order to bond the C4 bumps 121 to the package substrate upper bonding pads 114*a*.

FIG. 3E illustrates a vertical cross-sectional view of an intermediate structure in which the package underfill layer 129 may be formed on the package substrate 110 according to one or more embodiments. The package underfill layer 129 may be formed of an epoxy-based polymeric material. As illustrated in FIG. 3E, the package underfill layer 129 may be formed (e.g., injected) under and around the interposer module 120 and the C4 bumps 121 so as to fix the interposer module 120 to the package substrate 110. The package underfill layer 129 may then be cured, for example, in a box oven for about 90 minutes at about 150° C. to provide the package underfill layer 129 with a sufficient stiffness and mechanical strength.

FIG. 3F illustrates a vertical cross-sectional view of an intermediate structure in which the TIM layer 140 may be attached to the upper surface of the interposer module 120 according to one or more embodiments. The TIM layer 140 may include, for example, a gel TIM, graphite TIM, metal TIM, solder TIM and a carbon nanotube TIM. The TIM layer 140 may be attached to the upper surface of the interposer module 120 by applying a thermally conductive adhesive to the upper surface of the interposer module 120 (or to a bottom surface of the TIM layer 140), and then pressing the TIM layer 140 onto the interposer module 120.

FIG. 3G illustrates a vertical cross-sectional view of an intermediate structure in which the adhesive 160 may be applied to the package substrate 110 according to one or more embodiments. The adhesive 160 may include, for example, a silicone adhesive or an epoxy adhesive. The adhesive 160 may be located on the package substrate 110 at a position corresponding to a placement of the foot portion 150 and in a quantity sufficient to securely bond the foot portion 150 to the package substrate 110.

Figure 3H:
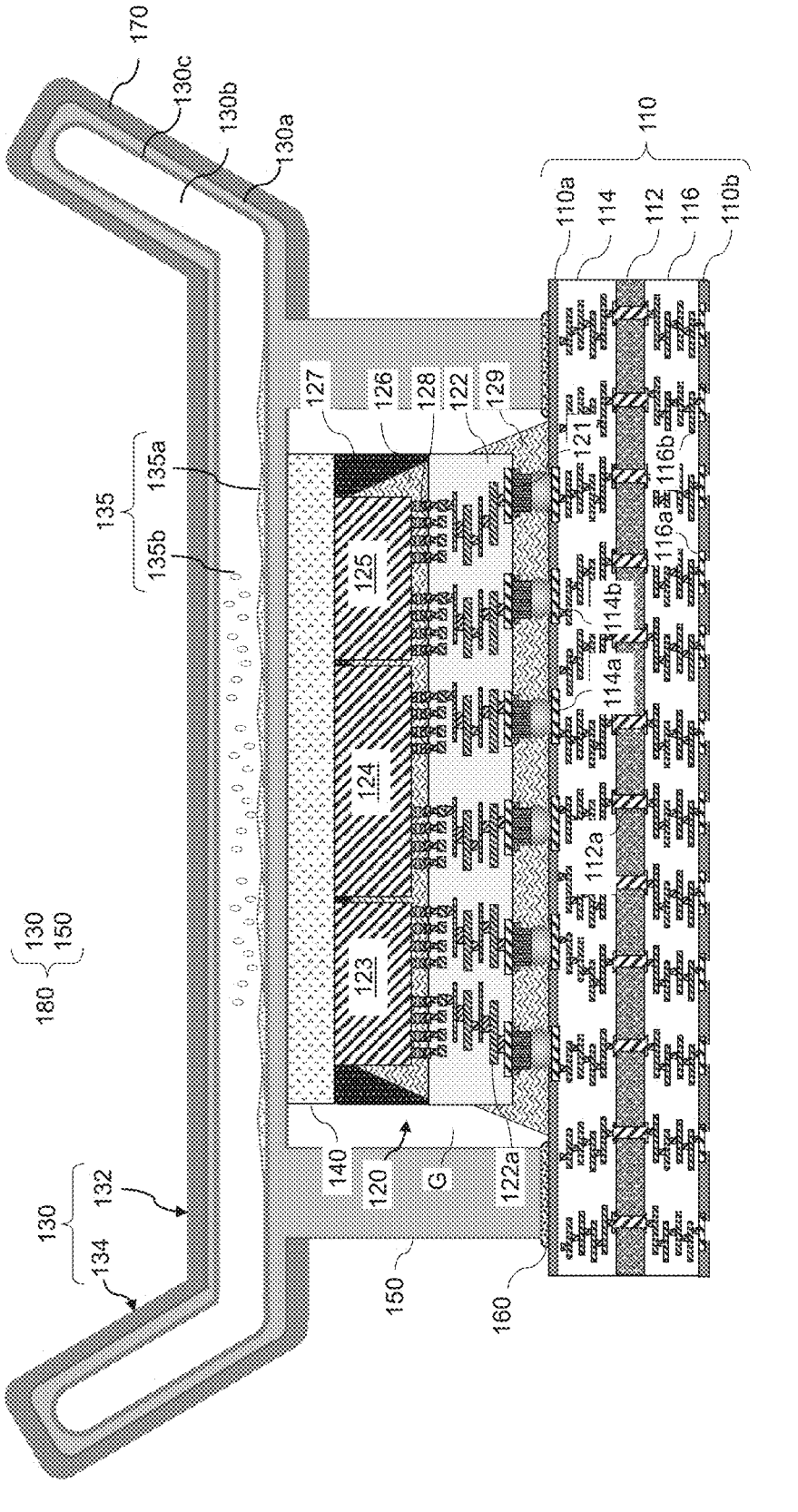
FIG. 3H illustrates a vertical cross-sectional view of an intermediate structure in which the package lid may be attached to (e.g., mounted on) the package substrate according to one or more embodiments
Figure 31:
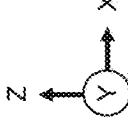

FIG. 3H illustrates a vertical cross-sectional view of an intermediate structure in which the package lid 180 may be attached to (e.g., mounted on) the package substrate 110 according to one or more embodiments. The package lid 180 may be formed as described above in FIGS. 2A-2D.

In FIG. 3H, the package substrate 110 with the interposer module 120 may be placed on a surface and the package lid 180 lowered down over the interposer module 120 and onto the package substrate 110. The foot portion 150 of the package lid 180 may then be aligned with the adhesive 160 (e.g., ring of adhesive material) formed on the package substrate 110. The plate portion 132 of the vapor chamber base 130 may thereby be located over the TIM layer 140. The package lid 180 may then be pressed downward by applying a pressing force down onto the vapor chamber base 130 of the package lid 180. In at least one embodiment, the pressing force may be applied to an upper surface of the plate portion 132 of the vapor chamber base 130.

The package lid 180 may then be clamped to the package substrate 110 for a period to allow the adhesive 160 to cure and form a secure bond between the package substrate 110 and the foot portion 150 of the package lid 180. The clamping of the package lid 180 to the package substrate 110 may be performed, for example, by using a heat clamp module. The heat clamp module may apply a uniform force across the upper surface of the package lid 180. In particular, the heat clamp module may apply a uniform force across the upper surface of the plate portion 132 of the vapor chamber base 130.

Alternatively, the package lid 180 may be placed on a surface (e.g., a flat surface), and the interposer module 120 on the package substrate 110 may be inverted and inserted into the foot portion 150 of the package lid 180. A downward force may then be applied to the package substrate lower surface layer 110*b* of the package substrate 110, in order to bond the package substrate 110 to the foot portion 150.

In another alternative, the foot portion 150 may be formed separately from the vapor chamber base 130. In that case, the foot portion 150 may be attached to the package substrate 110 by the adhesive 160. A second adhesive (which may be the same or different than adhesive 160) may be formed on an upper surface of the foot portion 150. The vapor chamber base 130 may then located over the foot portion 150 so that the plate portion 132 of the vapor chamber base 130 is on the TIM layer 140 of the interposer module 120. The package lid 180 may then be attached to the package substrate 110 by applying a pressing force down onto the vapor chamber base 130 of the package lid 180.

FIG. 3I illustrates a vertical cross-sectional view of an intermediate structure in which a plurality of solder balls 110*c* may be formed on the package substrate 110 according to one or more embodiments. The plurality of solder balls 110*c* may be formed on the lower bonding pads 116*a* through the openings in the package substrate lower surface layer 110*b*. The solder balls 110*c* may be formed, for example, by an electroplating process. The solder balls 110*c* may be formed, for example, so as to be located under the foot portion 150 and under the interposer module 120. The plurality of solder balls 110*c* may constitute a ball-grid array (BGA) that may allow the semiconductor package 100 to be securely mounted (e.g., by surface mount technology (SMT)) on a substrate such as a printed circuit board (PCB) and electrically coupled to the substrate. Formation of the solder balls 110c may complete the formation of the semiconductor package 100.

FIG. 4 is a flow chart illustrating a method of forming a semiconductor package according to one or more embodiments. Step 410 includes forming a package lid including a vapor chamber base that includes a plate portion and an angled portion extending at an angle from opposing ends of the plate portion. Step 420 includes mounting an interposer module on a package substrate. Step 430 includes locating a thermal interface material (TIM) layer on the interposer module. Step 440 includes locating the package lid on the interposer module and the TIM layer, and attaching the package lid to the package substrate.

Figure 5:
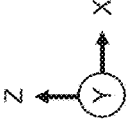
FIG. 5 illustrates a vertical cross-sectional view of an alternative design of the package lid according to one or more embodiments.

FIG. 5 illustrates a vertical cross-sectional view of an alternative design of the package lid 180 according to one or more embodiments. As illustrated in FIG. 5, in the alternative design, each of the angle θ1 and the angle θ2 may include acute angles less than 90° (e.g., acute angles). In particular, each of the angle θ1 and the angle θ2 may include acute angles greater than or equal to 80° (e.g., acute angles). By including angles greater than or equal to 80°, the alternative design may avoid a trapping of bubbles within the angle which may suppress bubble growth and have a negative impact for boiler heat transfer and result in poor thermal performance/

The package lid 180 having the first alternative design of FIG. 5 may be utilized, for example, when the semiconductor package 100 may need to have a smaller profile in the x-direction. Further, as illustrated in FIG. 5, even when angle θ1 and angle θ2 are acute angles, the distance Do between the distal end of the first angled portion part 134a and the distal end of the second angled portion part 134b may remain greater than or equal to the distance Dfo between opposing outer sides of the foot portion 150 in the x-direction.

FIG. 6 illustrates a plan view (e.g., top-down view) of a first alternative design of the semiconductor package 100, according to one or more embodiments. As illustrated in FIG. 6, in the first alternative design, the interposer module 120 may have a rectangular shape with a longitudinal direction in the y-direction. However, the package lid 180 may have a longitudinal direction in the x-direction. In particular, the vapor chamber base 130 may have a longitudinal direction in the x-direction.

Further, a length of the foot portion 150 in the y-direction may be substantially less than a length of the vapor chamber base 130 in the y-direction. Thus, as illustrated in FIG. 1F, the vapor chamber base 130 may extend beyond the foot portion 150 in the x-direction. This may allow the vapor chamber base 130 to provide a greater surface area for heat spreading and heat transfer than in a case where the length of the foot portion 150 and length of the vapor chamber base 130 are the same in the y-direction. In at least one embodiment, the length of the vapor chamber base 130 in the y-direction may be at least 1.2 times the length of the foot portion 150 in the y-direction.

Figure 7:
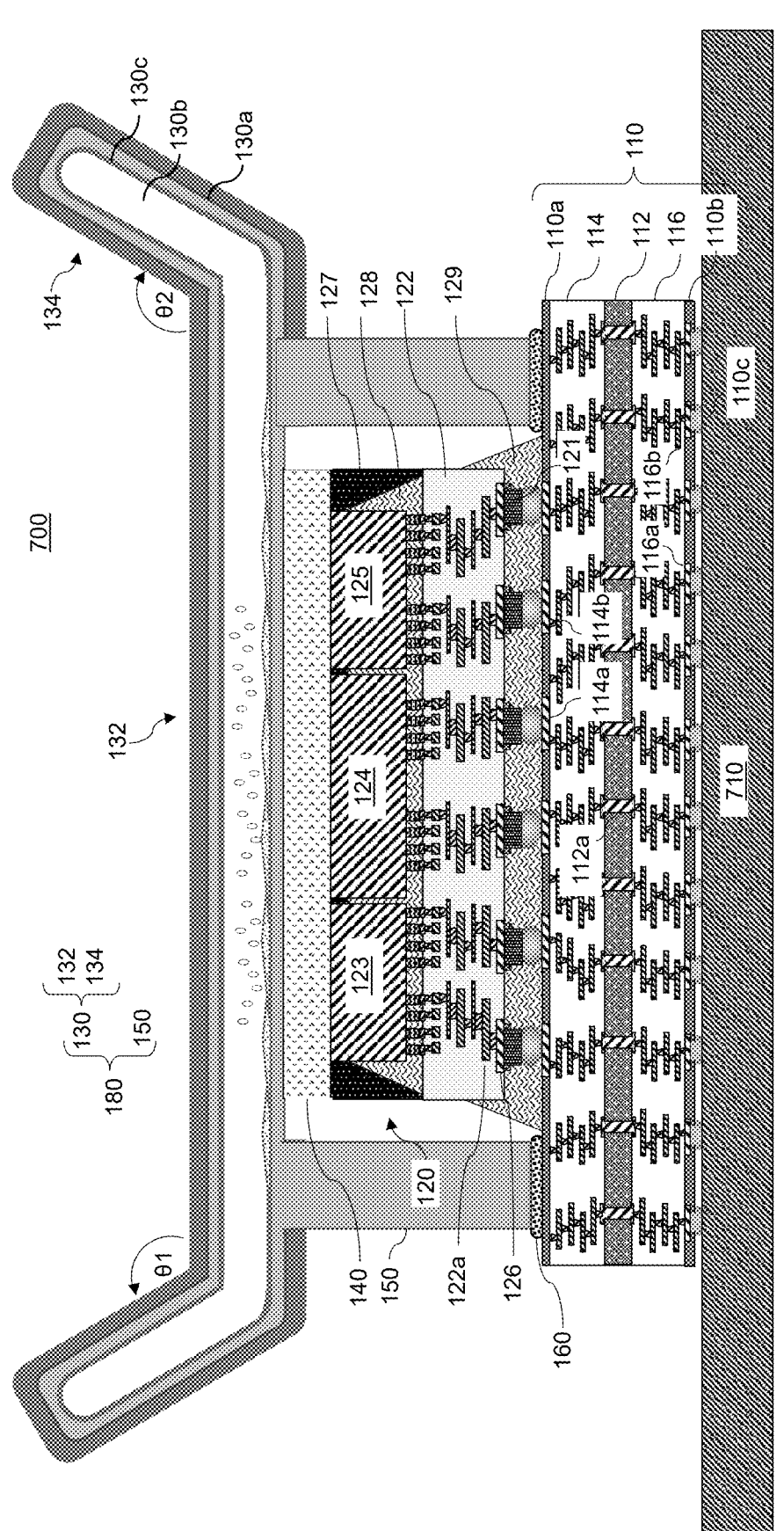
FIG. 7 illustrates a vertical cross-sectional view of a semiconductor device according to one or more embodiments.

FIG. 7 illustrates a vertical cross-sectional view of a semiconductor device 700 according to one or more embodiments. The semiconductor device 700 may include the semiconductor package 100 mounted on a substrate 710 (system board). The substrate 710 may include, for example, a PCB. As illustrated in FIG. 7, the semiconductor package 100 may be mounted on the substrate 710 by the plurality of solder balls 110c (e.g., BGA) on the board-side surface of the package substrate lower dielectric layer 116. The solder balls 110c may electrically couple the semiconductor package 100 to the substrate 710. The substrate 710 may including one or more dielectric layers including, for example, phenolic resin, fiberglass impregnated with epoxy resin, dielectric polymers (e.g., polyimide), etc. Conductive traces and vias may be formed in the dielectric layers of the substrate 710 and used to interconnect devices mounted on the substrate 710.

Figure 8:
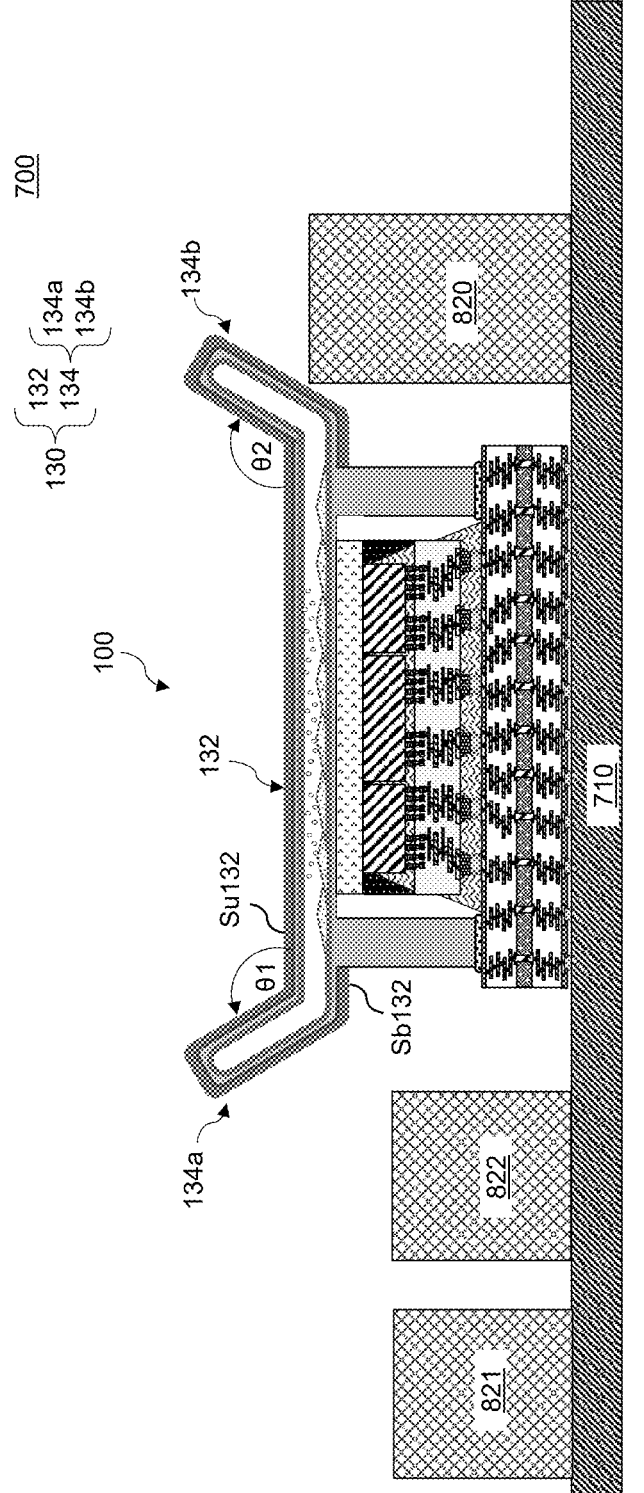
FIG. 8 illustrates a vertical cross-sectional view of an alternative design of the semiconductor device according to one or more embodiments.

FIG. 8 illustrates a vertical cross-sectional view of an alternative design of the semiconductor device 700 according to one or more embodiments. As illustrated in FIG. 8, in the alternative design of the semiconductor device 700, one or more electronic devices 820, 821, 822 (e.g., IC devices) may be mounted on the substrate 710 adjacent to the semiconductor package 100. The electronic devices 820, 821, 822 may be electrically connected to the semiconductor package 100 through conductive traces and vias formed in the dielectric layers of the substrate 710.

In may be beneficial for one or more of the electronic devices 820, 821, 822 (e.g., voltage regulator) to be located close to the semiconductor package 100 on the substrate 710. In addition, one or more of the electronic devices 820, 821, 822 may have a height that is greater than a height of the vacuum chamber base 130 in the semiconductor package 100. In particular, one or more of the electronic devices 820, 821, 822 may have a height that is greater than a height of the plate portion 132 of the vacuum chamber base 130. By providing the angled portion 134 having an angle (e.g., θ1, θ2) that is less than 180°, the alternative design of the semiconductor device 700 may avoid interference between the vapor chamber base 130 and any electronic devices 820, 821, 822 that may be located near the semiconductor package 100 on the substrate 710. Thus, the alternative design may allow for a vapor chamber base 130 having an increased size (e.g., increased area for heat spreading and heat transfer) without interfering with electronic devices 820, 821, 822 near the semiconductor package 100.

In particular, in FIG. 8, the electronic device 820 may include an IC device. The substrate 710 may include a system board (e.g., PCB). The semiconductor package 100 may include, for example, an HPC package. The semiconductor package 100 may be mounted on the substrate 710 adjacent to the electronic device 820. The electronic device 820 may include, for example, a voltage regulator that is electrically coupled to the semiconductor package 100 through the substrate 710, and regulates a voltage in the semiconductor package 100. As illustrated in FIG. 8, the first angled portion part 134a may extend over an upper surface of the electronic device 820. A height of the upper surface of the electronic device 820 may be greater than a height of a bottom surface Sb132 of the plate portion 132 of the vapor chamber base 130. In at least one embodiment, the height of the upper surface of the electronic device 820 may be greater than a height of an upper surface Su132 of the plate portion 132.

Figure 9:
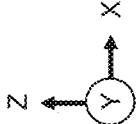
FIG. 9 illustrates a vertical cross-sectional view of an immersion cooling system that may be used to cool a semiconductor package according to one or more embodiments.

FIG. 9 illustrates a vertical cross-sectional view of an immersion cooling system 900 that may be used to cool a semiconductor package 100 according to one or more embodiments. The semiconductor package 100 may be included, for example, in a semiconductor device 700 (e.g., see FIGS. 7 and 8).

The immersion cooling system 900 may include, for example, a two-phase immersion cooling (2PIC) system. In particular, the immersion cooling system 900 may include an immersion cooling chamber 910. The immersion cooling chamber 910 may include, for example, an accessible tank (e.g., cylindrical container) formed of a metal, ceramic material, etc. The immersion cooling chamber 910 may include an immersion cooling chamber lid 915 that may be opened in order to access an interior of the immersion cooling chamber 910.

A coolant fluid 920 (immersion coolant) may be located in the immersion cooling chamber 910. The coolant fluid 920 may be in the liquid phase at room temperature. In at least one embodiment, the coolant fluid may have a boiling point less than about 60° C. The coolant fluid 920 may include, for example, a perfluorinated compound coolant.

The immersion cooling system 900 may also include a condenser unit 930 located above an upper surface of the coolant fluid 920. The condenser unit 930 may include, for example, a water-cooled condenser coil.

The semiconductor package 100 (e.g., included in a semiconductor device 700) may be placed in the immersion cooling chamber 910 so as to be submerged in the coolant fluid 920. The immersion cooling chamber lid 915 may be closed to form an air-tight seal. The semiconductor package 100 may be connected to an electrical power source and operated while inside the immersion cooling chamber 910.

During operation of the semiconductor package 100, heat generated within the interposer module 120 may be transferred to the vapor chamber base 130, thereby cooling the interposer module 120. The heated vapor chamber base 130 may then heat the coolant fluid 920 to the boiling point causing the coolant fluid 920 to boil forming vaporized coolant fluid 922, and thereby cooling the vapor chamber base 130. As illustrated in FIG. 9, the cavities of the enhancement surface 170 on the vapor chamber base 130 may help to form vapor bubbles 921 on the vapor chamber base 130 and thereby enhance heat spreading. In particular, the cavities may help to enhance a bubble growth density of the vapor bubbles 921 and effectively enhance boiling heat transfer. This may be especially helpful where the semiconductor package 100 includes a high power HPC semiconductor package.

The vaporized coolant fluid 922 may then rise in the immersion cooling chamber 910 and condense on the condenser unit 930. The liquid coolant fluid may then fall as liquid coolant fluid droplets 924 back into the body of coolant fluid 920 that may surround the semiconductor package 100. Thus, in at least one embodiment, no pump may be needed to return the condensed liquid coolant fluid back to the body of liquid coolant fluid 920.

FIG. 10 is a flow chart illustrating a method of cooling the semiconductor package 100 according to one or more embodiments. Step 1010 includes locating the semiconductor package in an immersion cooling chamber. Step 1020 includes immersing the semiconductor package in an immersion coolant in the immersion cooling chamber such that a plate portion and an angled portion of a vapor chamber base of the package lid is immersed in the immersion coolant. Step 1030 includes transferring heat from the plate portion and angled portion of the vapor chamber base to the immersion coolant to cool the semiconductor package.

Referring now to FIGS. 1A-10, a semiconductor package 100 may include a package substrate 110, an interposer module 120 on the package substrate 110, and a package lid 180 on the interposer module 120, and including a vapor chamber base 130 including a plate portion 132, and an angled portion 134 extending at an angle from opposing ends of the plate portion 132. The package lid 180 may further include an enhancement surface 170 including an uneven upper surface on the vapor chamber base 130. The enhancement surface 170 may include an enhancement layer including a plurality of cavities. A thickness Ts of the enhancement surface 170 may be less than or equal to 0.05 times a thickness Tt of the vapor chamber base 130. The enhancement surface 170 may include one of copper mesh or copper powder. A thickness Tw of a wall of the vapor chamber base 130 may be greater than or equal to 0.25 times a thickness Tt of the vapor chamber base 130. The opposing ends of the plate portion 132 may include a first end of the plate portion 132 and a second end of the plate portion 132 opposite the first end, and the angled portion 134 may include a first angled portion part 134a connected to the first end of the plate portion 132, and a second angled portion part 134b connected to the second end of the plate portion 132. A length of the plate portion 132 between the first end and the second end may be greater than a length of the interposer module 120. The first angled portion part 134a and the second angled portion part 134b may extend away from the interposer module 120. An angle θ1 between the plate portion 132 and the first angled portion part 134a may be in a range from 80° to less than 180°, and an angle θ2 between the plate portion 132 and the second angled portion part 134b may be in a range from 80° to less than 180°. The angle θ1 between the plate portion 132 and the first angled portion part 134a may be substantially equal to the angle θ2 between the plate portion 132 and the second angled portion part 134b. The package lid 180 may include a three-dimensional boiler lid structure for two-phase immersion cooling of the semiconductor package 100 in a two-phase immersion cooling system 900. The package lid 180 may further include an enhancement surface 170 including a plurality of cavities 172, 174 on the vapor chamber base 130 for promoting formation of bubbles in the two-phase immersion cooling of the semiconductor package 100.

Referring again to FIGS. 1A-10, a semiconductor device 700 may include a system board 710, an integrated circuit (IC) device 820 mounted on the system board 720, and a semiconductor package 100 mounted on the system board 710 adjacent to the IC device 820, the semiconductor package 100 including a package substrate 110, an interposer module 120 on the package substrate 110, and a package lid 180 on the interposer module 120 and including a vapor chamber base 130, the vapor chamber base 130 including a plate portion 132 and an angled portion 134 extending at an angle from opposing ends of the plate portion 132, wherein the angled portion 134 is located over the IC device 820. The package lid 180 may further include an enhancement surface 170 including an uneven upper surface on the vapor chamber base 130. The opposing ends of the plate portion 132 may include a first end of the plate portion 132, the angled portion 134 may include a first angled portion part 134a connected to the first end of the plate portion 132, and an angle between the plate portion 132 and the first angled portion part 134a may be in a range from 80° to less than 180°, and the first angled portion part 134a may extend over an upper surface of the IC device 820. The opposing ends of the plate portion 132 may further include a second end of the plate portion 132, and the angled portion 134 may further include a second angled portion part 134b connected to the second end of the plate portion 132, and the first angled portion part 134a and the second angled portion part 134b may extend away from the interposer module 120. The package lid 180 may include a three-dimensional boiler lid structure for two-phase immersion cooling of the semiconductor package 100 in a two-phase immersion cooling system 900. The package lid 180 may further include an enhancement surface including a plurality of cavities 172, 174 on the vapor chamber base 130 for promoting formation of bubbles in the two-phase immersion cooling of the semiconductor package 100.

Referring again to FIGS. 1A-10, a method of cooling a semiconductor package 100 having a package lid 180, may include locating the semiconductor package 100 in an immersion cooling chamber 910, immersing the semiconductor package 100 in an immersion coolant 920 in the immersion cooling chamber 910 such that a plate portion 132 and an angled portion 134 of a vapor chamber base 130 of the package lid 180 is immersed in the immersion coolant 920, and transferring heat from the plate portion 132 and angled portion 134 of the vapor chamber base 130 to the immersion coolant 920 to cool the semiconductor package 100. The plate portion 132 and angled portion 134 of the vapor chamber base 130 may include an enhancement surface 170, and the transferring of heat from the plate portion 132 and angled portion 134 of the vapor chamber base 130 may include enhancing bubble growth density with the enhancement surface 170.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of cooling a semiconductor package having a package lid, comprising:

locating the semiconductor package in an immersion cooling chamber;

immersing the semiconductor package in an immersion coolant in the immersion cooling chamber such that a plate portion and angled portion of a vapor chamber base of the package lid extending at an angle from opposing ends of the plate portion is immersed in the immersion coolant; and transferring heat from the plate portion and angled portion of the vapor chamber base to the immersion coolant to cool the semiconductor package.

2. The method of claim 1, wherein the transferring of heat comprises transferring heat from the vapor chamber base during an operation of the semiconductor package inside the immersion cooling chamber.

3. The method of claim 1, wherein the immersion coolant comprises a liquid immersion coolant surrounding the semiconductor package and the transferring of heat comprises vaporizing the liquid immersion coolant to form a vaporized immersion coolant above the liquid immersion coolant in the immersion cooling chamber.

4. The method of claim 3, further comprising:

condensing the vaporized immersion coolant with a condenser unit inside the immersion cooling chamber to form a condensed immersion coolant.

5. The method of claim 4, further comprising:

returning the condensed immersion coolant to the liquid immersion coolant as droplets of condensed immersion coolant from the condenser unit into the liquid immersion coolant.

6. A method of cooling a semiconductor device including a system board, an integrated circuit (IC) device on the system board, and a semiconductor package on the system board adjacent to the IC device, the semiconductor package including a package lid having a vapor chamber base with a plate portion and an angled portion extending at an angle from opposing ends of the plate portion, the vapor chamber base further including an enhancement surface, the method comprising:

locating the semiconductor package on the system board adjacent to the IC device;

transferring heat from a die module in the semiconductor package to the vapor chamber base of the package lid, wherein the enhancement surface on the plate portion and the angled portion enhances heat distribution over the die module by providing an uneven upper surface to increase heat dissipation efficiency; and dissipating heat from the enhancement surface on the plate portion and the angled portion of the vapor chamber base.

7. The method of claim 6, wherein the transferring of heat comprises transferring heat from the vapor chamber base during an operation of the semiconductor device.

8. The method of claim 6, wherein the enhancement surface includes the uneven upper surface on an outer wall of the vapor chamber base.

9. The method of claim 6, wherein the enhancement surface includes an enhancement layer including a plurality of cavities.

10. The method of claim 6, wherein a thickness of the enhancement surface is less than or equal to 0.05 times a thickness of the vapor chamber base.

11. The method of claim 6, wherein the enhancement surface includes one of copper mesh or copper powder.

12. The method of claim 6, wherein the enhancement surface on the angled portion extends over the IC device.

13. The method of claim 6, wherein the dissipating of heat is enhanced by the enhancement surface including a plurality of cavities to improve heat transfer efficiency.

14. A method of cooling a semiconductor device including a system board, an integrated circuit (IC) device on the system board, and a semiconductor package on the system board adjacent to the IC device, the semiconductor package including a package lid having a vapor chamber base with a plate portion and an angled portion extending at an angle from opposing ends of the plate portion, the vapor chamber base including a vapor base enclosure with a vapor chamber base wick structure, the method comprising:

locating the semiconductor package on the system board adjacent to the IC device;

transferring heat from a die module in the semiconductor package to the vapor chamber base of the package lid, wherein the vapor chamber base wick structure within the plate portion and the angled portion facilitates capillary action to enhance heat distribution over the die module; and dissipating heat from the vapor chamber base wick structure within the plate portion and the angled portion of the vapor chamber base.

15. The method of claim 14, wherein the transferring of heat comprises transferring heat from the vapor chamber base during an operation of the semiconductor device.

16. The method of claim 14, wherein the vapor chamber base wick structure includes a sintered metal material to enhance capillary action within the vapor base enclosure.

17. The method of claim 14, wherein the vapor chamber base wick structure comprises a plurality of microchannels.

18. The method of claim 14, wherein a thickness of a wall of the vapor chamber base is greater than or equal to 0.25 times a thickness of the vapor chamber base.

19. The method of claim 14, wherein the vapor chamber base wick structure is configured to maintain a uniform temperature distribution across the vapor chamber base.

20. The method of claim 14, wherein the vapor chamber base wick structure within the angled portion extends over the IC device.

* * * * *